(12) United States Patent
Sweeney et al.

(10) Patent No.: US 10,388,496 B2
(45) Date of Patent: Aug. 20, 2019

(54) THERMIONIC WAVE GENERATOR (TWG)

(71) Applicant: Space Charge, LLC, Aspen, CO (US)

(72) Inventors: Daniel Sweeney, San Diego, CA (US); Devin Vollmer, San Diego, CA (US); John Read, San Diego, CA (US)

(73) Assignee: Space Charge, LLC, Aspen, CO (US)

( * ) Notice: Subject to any disclaimer, the term of this patent is extended or adjusted under 35 U.S.C. 154(b) by 0 days.

(21) Appl. No.: 16/219,515

(22) Filed: Dec. 13, 2018

(65) Prior Publication Data

US 2019/0189410 A1 Jun. 20, 2019

Related U.S. Application Data

(60) Provisional application No. 62/598,582, filed on Dec. 14, 2017.

(51) Int. Cl.
*H01J 45/00* (2006.01)
*H03K 3/78* (2006.01)
*H03K 3/08* (2006.01)

(52) U.S. Cl.
CPC ............... *H01J 45/00* (2013.01); *H03K 3/08* (2013.01); *H03K 3/78* (2013.01)

(58) Field of Classification Search
CPC .. H01J 45/00; H03K 3/06; H03K 3/08; H03K 3/78; G21C 3/40; G21H 1/10; H02N 3/00
See application file for complete search history.

(56) References Cited

U.S. PATENT DOCUMENTS

| | | |
|---|---|---|
| 3,265,910 A | 8/1966 | Thomas |
| 3,328,611 A | 6/1967 | Davis |
| 3,460,524 A | 8/1969 | Lazaridis |
| 3,519,854 A | 7/1970 | Davis |
| 3,702,408 A | 11/1972 | Longsderff et al. |
| 4,303,845 A | 12/1981 | Davis |
| 4,323,808 A | 4/1982 | Davis |
| 5,459,367 A | 10/1995 | Davis |
| 5,780,954 A | 7/1998 | Davis |
| 5,810,980 A | 9/1998 | Edelson |
| 5,942,834 A | 8/1999 | Davis |
| 5,981,071 A | 11/1999 | Cox |
| 5,994,638 A | 11/1999 | Edelson |
| 6,064,137 A | 5/2000 | Cox |
| 6,103,298 A | 8/2000 | Edelson et al. |

(Continued)

FOREIGN PATENT DOCUMENTS

| | | | |
|---|---|---|---|
| CN | 105288675 | * 2/2016 | ............... A61L 2/08 |
| GB | 741058 A | 11/1955 | |

OTHER PUBLICATIONS

Rand, et al., "C12A7 Electride Hollow Cathode," Conference paper for the JANNAF Space Subcommittee meeting, Colorado Springs, CO, Apr. 29-May 3, 2013, 8 pages.

(Continued)

*Primary Examiner* — Matthew V Nguyen

(74) *Attorney, Agent, or Firm* — Kilpatrick Townsend & Stockton, LLP

(57) ABSTRACT

Energy conversion systems that may employ control grid electrodes, acceleration grid electrodes, inductive elements, multi-stage anodes, and emissive carbon coatings on the cathode and anode are described. These and other characteristics may allow for advantageous thermal energy to electrical energy conversion.

21 Claims, 15 Drawing Sheets

(56) References Cited

U.S. PATENT DOCUMENTS

| | | |
|---|---|---|
| 6,229,083 B1 | 5/2001 | Edelson |
| 6,211,465 B1 | 6/2001 | Streit |
| 6,495,843 B1 | 12/2002 | Tavkelidze |
| 6,762,543 B1 | 7/2004 | Kang et al. |
| 7,996,807 B2 * | 8/2011 | Grise .................. G06F 1/10 716/101 |
| 8,853,531 B2 | 10/2014 | Schwede et al. |
| 9,865,789 B2 | 1/2018 | Geballe et al. |
| 2005/0016575 A1 | 1/2005 | Kumar et al. |
| 2012/0227925 A1 * | 9/2012 | Sweeney .............. F01K 3/186 165/10 |

OTHER PUBLICATIONS

International Search Reports and Written Opinion for PCT/US2018/065494 dated Mar. 15, 2019, 10 pages.

* cited by examiner

THERMIONIC WAVE GENERATOR (TWG)

CROSS-REFERENCE TO RELATED APPLICATIONS

This application claims the benefit of and priority to U.S. Provisional Application No. 62/598,582, filed Dec. 14, 2017, which is hereby incorporated by reference in its entirety.

FIELD

The present invention comprises an efficient, portable, scalable, direct thermal to electrical delivery system, which can also incorporate energy storage. Specifically, a compact thermionic energy converter, known as a Thermionic Wave Generator (TWG), is described. The TWG uses electrode assemblies and, optionally, external magnetic assistance to form a moving wave of tightly packed electrons, and subsequently converts that wave into electrical power via an inductive element/collector sub-assembly. In certain applications, the TWG functions as a standalone, heat source-agnostic electrical generator. It may also function as part of an energy storage system using combustible fluids, as well as a back-end to a thermally regenerative energy storage system. In the latter application, hydrogen may be stored in a metal hydride, and that hydrogen can regenerate via a variety of reversible processes including solar concentration, solar thermal water cracking, and hydrolysis.

BACKGROUND

Distributed Generation (DG)—power generation that is located on-site at the point of use—is an alternative to the centralized power generation model. The DG sector is growing at 15% annually and is predicted reach $500 billion global market size by 2025. DG advantages over the centralized generation model include high efficiency, disaster resilience, and security. Renewables, such as wind and solar, represent a large portion of the DG market, and thermal DG technologies such as reciprocating engines and gas & steam turbines are in widespread use.

SUMMARY

Described herein are thermal energy to electrical energy power conversion systems, referred to herein as Thermionic Wave Generators (TWGs). TWGs can receive heat energy from any of a variety of heat sources and generate a thermally emitted wave of electrons that can be captured to generate electrical currents and voltages.

In thermionic converters, direct energy conversion from a heat source is made possible by using the phenomenon of thermionic emission. An emitter fabricated from a refractory material is heated to a high temperature and spontaneously begins to boil off electrons into the surrounding space. Continuously supplied thermal energy drives this flow of electrons.

The efficiency of the system is expressed as that percentage of thermal energy converted to 1) electron emissions, 2) transmission of those emissions to a collector for usable electrical power, and 3) loss of thermal energy into the surroundings.

In a first aspect, energy converters, such as thermionic energy converters and/or thermionic wave generators are described. In one example, an energy converter of this aspect comprises a first electrode for emitting electrons, such as a first electrode that includes an emissive carbon coating over at least a portion of a surface of the first electrode; a second electrode adjacent to first electrode; a third electrode adjacent to the second electrode, such as a second electrode that is positioned between the third electrode and the first electrode; a fourth electrode for collecting electrons emitted from the first electrode, such as a fourth electrode that is positioned so the third electrode is positioned between the second electrode and the fourth electrode; and a housing defining an enclosed evacuated volume. In embodiments, the first electrode, the second electrode, the third electrode, and the fourth electrode are positioned within the enclosed evacuated volume. Optionally, a system of this aspect may further comprise an inductive element adjacent to the third electrode, such as an inductive element positioned between the third electrode and the fourth electrode. The first electrode may advantageously have a lower potential than the fourth electrode so that emitted electrons are accelerated toward the fourth electrode, for example.

The first electrode may advantageously comprise a cathode, such as a hot cathode useful for emitting thermal electrons. In some embodiments, the first electrode comprises a material having a work function of from about 0.25 eV to about 3 eV, such as from 0.25 eV to 1.0 eV, from 0.25 eV to 1.5 eV, from 0.25 eV to 2.0 eV, from 0.25 eV to 2.5 eV, from 0.5 eV to 3.0 eV, from 1.0 eV to 1.5 eV, from 1.0 eV to 2.0 eV, from 1.0 eV to 2.5 eV, from 1.0 eV to 3.0 eV, from 1.5 eV to 2.0 eV, from 1.5 eV to 2.5 eV, from 1.5 eV to 3.0 eV, from 2.0 eV to 2.5 eV, from 2.0 eV to 3.0 eV, or from 2.5 eV to 3.0 eV. Optionally, the first electrode comprises a refractory metal. Example refractory metals include Ti, V, Cr, Mn, Zr, Nb, Mo, Tc, Ru, Rh, Hf, Ta, W, Re, Os, Ir, and alloys thereof.

Optionally, the first electrode includes a plurality of microtips extending from a base surface of the first electrode. Microtips may be useful, in some embodiments, for reducing an effective work function of the first electrode and advantageously allow for emission of thermal electrons from the first electrode at lower temperatures than would be otherwise expected based on a material of the first electrode or based on materials properties of the first electrode. Optionally, the first electrode includes the emissive carbon coating over at least a portion of the microtips. Example microtips may exhibit a first cross-sectional dimension at a base surface of the first electrode and a smaller cross-sectional dimension at a distance from the base surface. Optionally, the plurality of microtips exhibit a height to width ratio of from about 4 to about 10, such as from 4 to 5, from 4 to 6, from 4 to 7, from 4 to 8, from 4 to 9, from 4 to 10, from 5 to 6, from 5 to 7, from 5 to 8, from 5 to 9, from 5 to 10, from 6 to 7, from 6 to 8, from 6 to 9, from 6 to 10, from 7 to 8, from 7 to 9, from 7 to 10, from 8 to 9, from 8 to 10, or from 9 to 10. Example microtips may exhibit cross-sectional or height dimensions of from about 50 nm to about 100 μm, such as from 50 nm to 100 nm, from 50 nm to 500 nm, from 50 nm to 1 μm, from 50 nm to 5 μm, from 50 nm to 10 μm, from 50 nm to 50 μm, from 50 nm to 100 μm, from 100 nm to 500 nm, from 100 nm to 1 μm, from 100 nm to 5 μm, from 100 nm to 10 μm, from 100 nm to 50 μm, from 100 nm to 100 μm, from 500 nm to 1 μm, from 500 nm to 5 μm, from 500 nm to 10 μm, from 500 nm to 50 μm, from 500 nm to 100 μm, from 1 μm to 5 μm, from 1 μm to 10 μm, from 1 μm to 50 μm, from 1 μm to 100 μm, from 5 μm to 10 μm, from 5 μm to 50 μm, from 5 μm to 100 μm, from 10 μm to 50 μm, from 10 μm to 100 μm, or from 50 μm to 100

µm. In specific examples, the plurality of microtips may comprise vertically arrayed carbon nanotubes, diamondoids, or alkaline metal oxides.

Optionally, the first electrode includes a low work function surface utilizing a crystalline ceramic electride in which electrons clathrated in subnanometer-sized cages act as a conductive medium. For example, $12CaO-7Al_2O_3$ (sometimes known as C12A7), is not consumed during operation, and can take advantage of the electride's capability of low work function and of starting at room temperature without the benefit of a heater. Such materials may advantageously be useful as or in a first electrode since it can emit electrons at low temperatures, such as around 400 K. Accordingly, in some embodiments, the first electrode comprises a crystalline ceramic electride, such as $12CaO-7Al_2O_3$ or an electride thereof, for example a coating of a crystalline ceramic electride. Crystalline ceramic electrides may be formed, for example, by combining suitable precursors (e.g., $CaCO_3$ and $Al_2O_3$ in the case of C12A7), and heating to high temperature, such as from 1600° C. to 1800° C., in a graphite crucible.

Optionally, the first electrode is fabricated using one or more microfabrication techniques. Microfabrication may advantageously allow for precise control over position, thickness, microtip dimensions, spacings, or the like. Optionally, the first electrode is deposited onto a MoCu alloy substrate. Example thicknesses for the first electrode include from 10 nm to 20 µm, such as from 10 nm to 20 nm, from 10 nm to 50 nm, from 10 nm to 100 nm, from 10 nm to 200 nm, from 10 nm to 500 nm, from 10 nm to 1 µm, from 10 nm to 2 µm, from 10 nm to 5 µm, from 10 nm to 10 µm, from 10 nm to 20 µm, from 20 nm to 50 nm, from 20 nm to 100 nm, from 20 nm to 200 nm, from 20 nm to 500 nm, from 20 nm to 1 µm, from 20 nm to 2 µm, from 20 nm to 5 µm, from 20 nm to 10 µm, from 20 nm to 20 µm, from 50 nm to 100 nm, from 50 nm to 200 nm, from 50 nm to 500 nm, from 50 nm to 1 µm, from 50 nm to 2 µm, from 50 nm to 5 µm, from 50 nm to 10 µm, from 50 nm to 20 µm, from 100 nm to 200 nm, from 100 nm to 500 nm, from 100 nm to 1 µm, from 100 nm to 2 µm, from 100 nm to 5 µm, from 100 nm to 10 µm, from 100 nm to 20 µm, from 200 nm to 500 nm, from 200 nm to 1 µm, from 200 nm to 2 µm, from 200 nm to 5 µm, from 200 nm to 10 µm, from 200 nm to 20 µm, from 500 nm to 1 µm, from 500 nm to 2 µm, from 500 nm to 5 µm, from 500 nm to 10 µm, from 500 nm to 20 µm, from 1 µm to 2 µm, from 1 µm to 5 µm, from 1 µm to 10 µm, from 1 µm to 20 µm, from @ µm to 5 µm, from 2 µm to 10 µm, from 2 µm to 20 µm, from 5 µm to 10 µm, from 5 µm to 20 µm, or from 10 µm to 20 µm.

Emissive carbon coatings may be useful, in some embodiments, for reducing an effective work function of the first electrode and advantageously allow for emission of thermal electrons from the first electrode at lower temperatures than would be otherwise expected based on a material of the first electrode or based on materials properties of the first electrode. Example emissive carbon coatings comprise a doped or undoped amorphous carbon coating. Example emissive carbon coating comprises a doped or undoped nanodiamond coating. Optionally, an emissive carbon coating may be doped with one or more of hydrogen, nitrogen, or boron. Optionally, an emissive carbon coating is deposited using a chemical vapor deposition process or a physical vapor deposition process. Example emissive carbon coatings may exhibit a thickness of from about 50 nm to about 100 µm, such as from 50 nm to 100 nm, from 50 nm to 500 nm, from 50 nm to 1 µm, from 50 nm to 5 µm, from 50 nm to 10 µm, from 50 nm to 50 µm, from 50 nm to 100 µm, from 100 nm to 500 nm, from 100 nm to 1 µm, from 100 nm to 5 µm, from 100 nm to 10 µm, from 100 nm to 50 µm, from 100 nm to 100 µm, from 500 nm to 1 µm, from 500 nm to 5 µm, from 500 nm to 10 µm, from 500 nm to 50 µm, from 500 nm to 100 µm, from 1 µm to 5 µm, from 1 µm to 10 µm, from 1 µm to 50 µm, from 1 µm to 100 µm, from 5 µm to 10 µm, from 5 µm to 50 µm, from 5 µm to 100 µm, from 10 µm to 50 µm, from 10 µm to 100 µm, or from 50 µm to 100 µm.

The first electrode may have any suitable surface area and lateral dimensions. Example surface area for the first electrode may be from about $0.001$ $cm^2$ to about $50$ $cm^2$, such as from $0.001$ $cm^2$ to $0.005$ $cm^2$, from $0.001$ $cm^2$ to $0.01$ $cm^2$, from $0.001$ $cm^2$ to $0.05$ $cm^2$, from $0.001$ $cm^2$ to $0.1$ $cm^2$, from $0.001$ $cm^2$ to $0.5$ $cm^2$, from $0.001$ $cm^2$ to $1$ $cm^2$, from $0.001$ $cm^2$ to $5$ $cm^2$, from $0.001$ $cm^2$ to $10$ $cm^2$, from $0.001$ $cm^2$ to $50$ $cm^2$, from $0.005$ $cm^2$ to $0.01$ $cm^2$, from $0.005$ $cm^2$ to $0.05$ $cm^2$, from $0.005$ $cm^2$ to $0.1$ $cm^2$, from $0.005$ $cm^2$ to $0.5$ $cm^2$, from $0.005$ $cm^2$ to $1$ $cm^2$, from $0.005$ $cm^2$ to $5$ $cm^2$, from $0.005$ $cm^2$ to $10$ $cm^2$, from $0.005$ $cm^2$ to $50$ $cm^2$, from $0.01$ $cm^2$ to $0.05$ $cm^2$, from $0.01$ $cm^2$ to $0.1$ $cm^2$, from $0.01$ $cm^2$ to $0.5$ $cm^2$, from $0.01$ $cm^2$ to $1$ $cm^2$, from $0.01$ $cm^2$ to $5$ $cm^2$, from $0.01$ $cm^2$ to $10$ $cm^2$, from $0.01$ $cm^2$ to $50$ $cm^2$, from $0.05$ $cm^2$ to $0.1$ $cm^2$, from $0.05$ $cm^2$ to $0.5$ $cm^2$, from $0.05$ $cm^2$ to $1$ $cm^2$, from $0.05$ $cm^2$ to $5$ $cm^2$, from $0.05$ $cm^2$ to $10$ $cm^2$, from $0.05$ $cm^2$ to $50$ $cm^2$, from $0.1$ $cm^2$ to $0.5$ $cm^2$, from $0.1$ $cm^2$ to $1$ $cm^2$, from $0.1$ $cm^2$ to $5$ $cm^2$, from $0.1$ $cm^2$ to $10$ $cm^2$, from $0.1$ $cm^2$ to $50$ $cm^2$, from $0.5$ $cm^2$ to $1$ $cm^2$, from $0.5$ $cm^2$ to $5$ $cm^2$, from $0.5$ $cm^2$ to $10$ $cm^2$, from $0.5$ $cm^2$ to $50$ $cm^2$, from $1$ $cm^2$ to $5$ $cm^2$, from $1$ $cm^2$ to $10$ $cm^2$, from $1$ $cm^2$ to $50$ $cm^2$, from $5$ $cm^2$ to $10$ $cm^2$, from $5$ $cm^2$ to $50$ $cm^2$, or from $10$ $cm^2$ to $50$ $cm^2$.

Optionally, the second electrode comprises a control grid electrode. Control grid electrodes may advantageously be used to reduce or eliminate space charge effects in the thermal emission of electrons from an underlying electrode, such as a hot cathode. Control grid electrodes may have a negative potential relative to an underlying electrode, such as a potential that may repel electrons. Optionally, a potential applied to the second electrode varies as a function of time. Optionally, the second electrode has a lower potential than the first electrode. Optionally, the second electrode comprises is electrically connected to the first electrode. Optionally, the second electrode comprises a grid electrode or electrode array having electrode elements arranged in a grid configuration. For example, the second electrode may covers up to 30% (e.g., 0% to 30%) of a surface area of the first electrode. Optionally, 70% or more (e.g., 70% to 100%) of the surface area of the first electrode is exposed through apertures or spacing regions of the second electrode. Optionally, the first electrode emits electrons that pass through apertures or spacing regions of the second electrode. Optionally, a potential applied to the second electrode modulates a current of electrons between the first electrode and the fourth electrode. Optionally, a potential applied to the second electrode focuses electrons between the first electrode and the fourth electrode. Optionally, the second electrode is fabricated using one or more microfabrication techniques. Optionally, is fabricated by patterning layers of conductive and insulating materials in a grid arrangement. Optionally, the second electrode is separated from the first electrode by an inter electrode spacing of from 5 µm to 400 µm.

Optionally, the third electrode comprises an acceleration grid electrode. Acceleration grid electrodes are useful for accelerating electrons emitted by an underlying electrode, such as a hot cathode and that may be modulated by an underlying electrode, such as a control grid electrode. In some examples, the third electrode has a potential that varies as a function of time. Example potentials include those having a square wave modulation with a frequency of from about 1 kHz to about 1 MHz, such as from 1 kHz to 5 kHz, from 1 kHz to 10 kHz, from 1 kHz to 50 kHz, from 1 kHz to 100 kHz, from 1 kHz to 500 kHz, from 1 kHz to 1 MHz, from 5 kHz to 10 kHz, from 5 kHz to 50 kHz, from 5 kHz to 100 kHz, from 5 kHz to 500 kHz, from 5 kHz to 1 MHz, from 10 kHz to 50 kHz, from 10 kHz to 100 kHz, from 10 kHz to 500 kHz, from 10 kHz to 1 MHz, from 50 kHz to 100 kHz, from 50 kHz to 500 kHz, from 50 kHz to 1 MHz, from 100 kHz to 500 kHz, from 100 kHz to 1 MHz, or from 500 kHz to 1 MHz. Example potentials include those having a sinusoidal modulation with a frequency of from about 25 Hz to about 400 Hz, such as from 25 Hz to 40 Hz, from 25 Hz to 50 Hz, from 25 Hz to 60 Hz, from 25 Hz to 80 Hz, from 25 Hz to 100 Hz, from 25 Hz to 120 Hz, from 25 Hz to 150 Hz, from 25 Hz to 160 Hz, from 25 Hz to 200 Hz, from 25 Hz to 240 Hz, from 25 Hz to 300 Hz, from 25 Hz to 400 Hz, from 40 Hz to 50 Hz, from 40 Hz to 60 Hz, from 40 Hz to 80 Hz, from 40 Hz to 100 Hz, from 40 Hz to 120 Hz, from 40 Hz to 150 Hz, from 40 Hz to 160 Hz, from 40 Hz to 200 Hz, from 40 Hz to 240 Hz, from 40 Hz to 300 Hz, from 40 Hz to 400 Hz, from 50 Hz to 60 Hz, from 50 Hz to 80 Hz, from 50 Hz to 100 Hz, from 50 Hz to 120 Hz, from 50 Hz to 150 Hz, from 50 Hz to 160 Hz, from 50 Hz to 200 Hz, from 50 Hz to 240 Hz, from 50 Hz to 300 Hz, from 50 Hz to 400 Hz, from 60 Hz to 80 Hz, from 60 Hz to 100 Hz, from 60 Hz to 120 Hz, from 60 Hz to 150 Hz, from 60 Hz to 160 Hz, from 60 Hz to 200 Hz, from 60 Hz to 240 Hz, from 60 Hz to 300 Hz, from 60 Hz to 400 Hz, from 80 Hz to 100 Hz, from 80 Hz to 120 Hz, from 80 Hz to 150 Hz, from 80 Hz to 160 Hz, from 80 Hz to 200 Hz, from 80 Hz to 240 Hz, from 80 Hz to 300 Hz, from 80 Hz to 400 Hz, from 100 Hz to 120 Hz, from 100 Hz to 150 Hz, from 100 Hz to 160 Hz, from 100 Hz to 200 Hz, from 100 Hz to 240 Hz, from 100 Hz to 300 Hz, from 100 Hz to 400 Hz, from 120 Hz to 150 Hz, from 120 Hz to 160 Hz, from 120 Hz to 200 Hz, from 120 Hz to 240 Hz, from 120 Hz to 300 Hz, from 120 Hz to 400 Hz, from 150 Hz to 160 Hz, from 150 Hz to 200 Hz, from 150 Hz to 240 Hz, from 150 Hz to 300 Hz, from 150 Hz to 400 Hz, from 160 Hz to 200 Hz, from 160 Hz to 240 Hz, from 160 Hz to 300 Hz, from 160 Hz to 400 Hz, from 200 Hz to 240 Hz, from 200 Hz to 300 Hz, from 200 Hz to 400 Hz, from 240 Hz to 300 Hz, from 240 Hz to 400 Hz, from 300 Hz to 400 Hz, about 25 Hz, about 50 Hz, about 60 Hz, about 80 Hz, about 100 Hz, about 120 Hz, about 150 Hz, about 160 Hz, about 200 Hz, about 240 Hz, about 300 Hz, or about 400 Hz. Example potentials include those having a square wave modulation with a first frequency and a second sinusoidal modulation with a second frequency. Optionally, the third electrode covers up to 30% of a surface area of the first electrode. Optionally, up to 70% or more of the surface area of the first electrode is exposed through apertures or spacing regions of the third electrode. Optionally, the third electrode has a higher potential than the first electrode. Optionally, the first electrode emits electrons that pass through apertures of the third electrode. Optionally, a potential applied to the third electrode modulates a velocity of electrons passing through apertures of the third electrode. Optionally, a potential applied to the third electrode focuses electrons passing through apertures of the third electrode. Optionally, the third electrode is fabricated using one or more microfabrication techniques.

As noted above, systems of this aspect may optionally further comprise an inductive element adjacent to the third electrode, such as an inductive element positioned between the third electrode and the fourth electrode. Example inductive elements optionally comprises an air core inductor, such as an air core solenoid. Example inductive elements optionally comprise a solid core inductor, for example including a ferrite core or an iron core. Optionally, an inductive element comprises a toroidal core inductor or a pot core inductor. Optionally, the first electrode emits electrons that pass through a central opening of the inductive element. Electrons passing through a core of the inductive element may advantageously induce a current in the inductive element and/or induce a voltage across the inductive element. Optionally, electrons passing through a core of the inductive element are decelerated by interactions with the inductive element. Example inductive elements comprise a conductive material arranged in a coil shaped geometry, a planar spiral geometry, a zig-zag geometry, or any combination of these.

The fourth electrode may advantageously function as a cathode or collector. Optionally, the fourth electrode has a non-planar geometry. Example materials for the fourth electrode include those having a work function of from about 0.25 eV to about 3.0 eV, such as from 0.25 eV to 1.0 eV, from 0.25 eV to 1.5 eV, from 0.25 eV to 2.0 eV, from 0.25 eV to 2.5 eV, from 0.5 eV to 3.0 eV, from 1.0 eV to 1.5 eV, from 1.0 eV to 2.0 eV, from 1.0 eV to 2.5 eV, from 1.0 eV to 3.0 eV, from 1.5 eV to 2.0 eV, from 1.5 eV to 2.5 eV, from 1.5 eV to 3.0 eV, from 2.0 eV to 2.5 eV, from 2.0 eV to 3.0 eV, or from 2.5 eV to 3.0 eV. Optionally, the fourth electrode comprises a plurality of stages. Using multiple stages may be advantageous to reduce or eliminate secondary electron generation, for example. Optionally, the fourth electrode comprises an array of collector elements. For example, the collector elements in the array may optionally be individually positioned above openings within the second electrode and the third electrode. The fourth electrode may optionally have a second emissive carbon coating, such as an emissive carbon coating comprising a doped or undoped carbon coating. For example, the second emissive carbon coating may comprise a doped or undoped nanodiamond coating. Optionally, the fourth electrode comprises one or more recessed regions or one or more raised regions.

The enclosed evacuated volume in which the electrodes may be arranged may have any suitable pressure. During operation, low pressure is desirable, such as a pressure in which the mean free path for electron collision with gas in the enclosed evacuated volume is less than a distance between the first electrode and the fourth electrode. In examples, the enclosed evacuated volume has a pressure of $10^{-5}$ Torr to $10^{-12}$ Torr, such as from $10^{-7}$ Torr to $10^{-12}$ Torr, from $10^{-8}$ Torr to $10^{-12}$ Torr, from $10^{-9}$ Torr to $10^{-12}$ Torr, from $10^{-10}$ Torr to $10^{-12}$ Torr, from $10^{-11}$ Torr to $10^{-12}$ Torr, from $10^{-7}$ Torr to $10^{-11}$ Torr, from $10^{-8}$ Torr to $10^{-11}$ Torr, from $10^{-9}$ Torr to $10^{-11}$ Torr, from $10^{-10}$ Torr to $10^{-11}$ Torr, from $10^{-7}$ Torr to $10^{-10}$ Torr, from $10^{-8}$ Torr to $10^{-10}$ Torr, from $10^{-9}$ Torr to $10^{-10}$ Torr, from $10^{-7}$ Torr to $10^{-9}$ Torr, from $10^{-8}$ Torr to $10^{-9}$ Torr, or from $10^{-7}$ Torr to $10^{-8}$ Torr. Optionally, a getter is positioned within the enclosed evacuated volume for removing gas from within the evacuated volume. Optionally, the housing is hermetically sealed.

Optionally, energy converters of this aspect may further comprise a magnetic field source positioned to direct a magnetic field between the cathode and the anode. Example magnetic field sources include a permanent magnet or an electromagnet. Optionally, an energy converter of this aspect may further comprise a magnetic core positioned for concentrating and guiding the magnetic field between the first electrode and the second electrode. For example, magnetic field lines generated by the magnetic field source may be arranged along a direction between the first electrode and the fourth electrode. Optionally magnetic lines generated by the magnetic field source may be arranged along a direction parallel to an average electron trajectory between the first electrode and the fourth electrode.

Energy converters of this aspect may optionally further comprise additional elements. For example, energy converters of this aspect may optionally further comprise a thermal conductor in thermal communication with the first electrode, such as thermal conductor for receiving radiant energy or thermal energy to heat the first electrode. Energy converters of this aspect may optionally further comprise one or more electrically insulating spacer elements between adjacent electrodes. Energy converters of this aspect may advantageously optionally further comprise a switching power supply for generating voltages applied to one or more electrodes, such as a switching power supply is in electrical communication with the one or more electrodes. Optionally, energy converters of this aspect may further comprise a control circuit in electrical communication with one or more electrodes for modulating potentials applied to one or more electrodes. Optionally, energy converters of this aspect may further comprise a dynode positioned adjacent to the third electrode, such as the dynode is positioned between the third electrode and the inductive element. Optionally, an inter-element spacing between the dynode and the third electrode is from about 0.5 μm to about 200 μm. Optionally, the dynode has a higher potential than the third electrode. Optionally, the dynode comprises one or more of a metal foil, synthetic diamond, or a secondary electron emission coating. Energy converters of this aspect may optionally further comprise one or more conductive alloy electrodes for fixing positions of the first electrode, the second electrode, or the third electrode.

In another aspect, systems are described, such as energy conversion systems. An example system of this aspect comprises a heat source; and a plurality of energy converters arranged in a spaced configuration about the heat source. Optionally, the plurality of energy converters are arranged radially about the heat source. Optionally, the heat source comprises a combustor. Optionally, the plurality of energy converters make up a majority of one or more walls of the combustor. Optionally, multiple energy converters are arranged in a tandem configuration to provide cascading thermal conversion. Optionally, at least a portion of one or more walls of the combustor include 3-dimensional surface features that reflect electromagnetic radiation having wavelengths of from 0.8 μm to 1.5 μm. Optionally, at least a portion of one or more walls of the combustor are coated with or comprise aluminum zinc-doped oxide to suppress emission of black body radiation at wavelengths greater than 1.5 μm or from 1.5 μm to 5 μm. Optionally, the combustor has a temperature of from about 400° C. to about 1100° C. and generates black body electromagnetic radiation. Optionally, at least a portion of the black body electromagnetic radiation is transmitted and absorbed by the plurality of energy converters to heat portions of the plurality of energy converters. Example energy converters useful with the systems of this aspect may comprise any of the energy converters described herein.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

DETAILED DESCRIPTION

Figure 1:
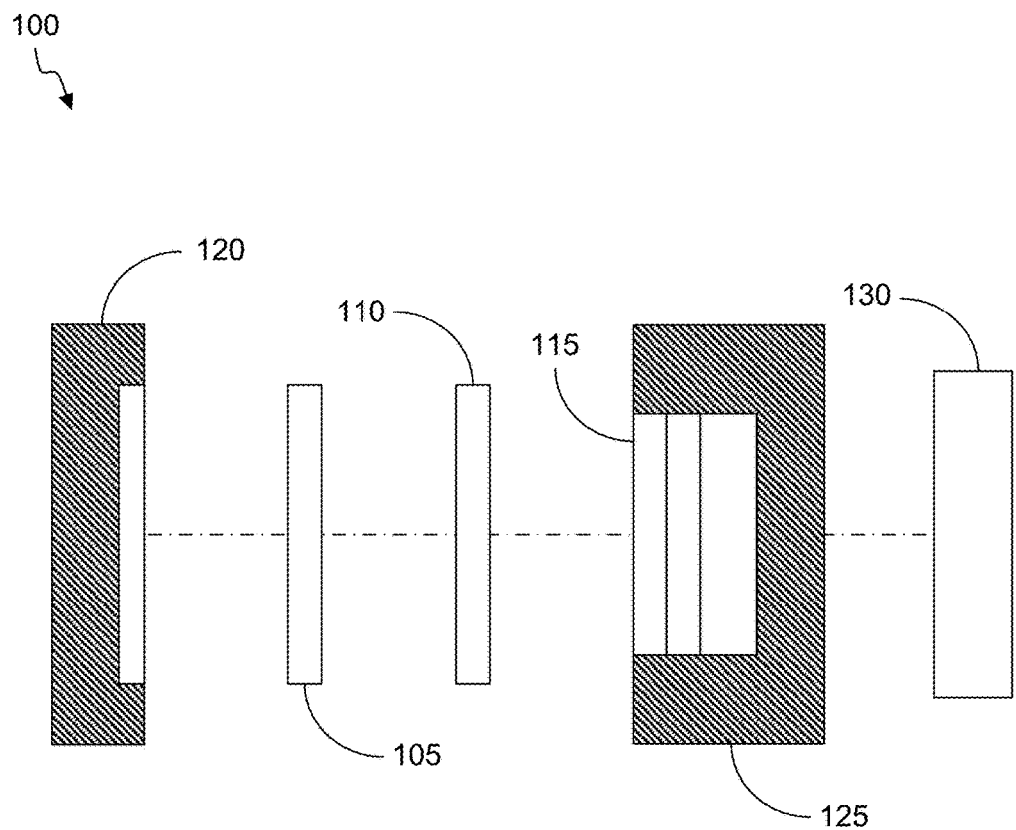
FIG. 1 provides a schematic illustration of various components and subassemblies used to fabricate a Thermionic Wave Generator.

Described herein are thermal energy to electrical energy conversion systems, referred to herein as Thermionic Wave Generators (TWGs). TWGs can receive heat energy from any of a variety of heat sources and generate a thermally emitted wave of electrons that can be captured to generate electrical currents and voltages. In their simplest description, TWGs include features comparable to a vacuum tube or thermionic converter, but the TWGs described herein include additional advantageous characteristics that allow them to function efficiently for thermal conversion. For example, the disclosed TWGs may employ, control grid electrodes, acceleration grid electrodes, inductive elements, multi-stage anodes, and emissive carbon coatings on the cathode and anode to allow for advantageous thermal energy to electrical energy conversion.

Overview of Thermionic Converters

In thermionic converters, direct energy conversion from a heat source is made possible by using the phenomenon of thermionic emission. An emitter fabricated from a refractory material is heated to a high temperature and spontaneously begins to boil off electrons into the surrounding space. Continuously supplied thermal energy drives this flow of electrons. These electrons must have enough energy to escape the surface work function of the emitter. Lower surface work functions result in reduced operating temperatures, higher efficiencies, and larger power densities.

Electrons have negative charges and, therefore, repel one another. The emission of electrons into the inter-electrode space creates a negatively charged electric field that repulses neighboring electrons. This results in a choking effect that reduces the flow rate of the emission, known as a 'space charge' effect. The collector of the device can also emit electrons that travel to the emitter, in some instances known as 'secondary emission'. The effect is a reversal in current that reduces overall the electrical output. The output voltage of a thermionic energy converter is limited to the work functions of the materials selected for the emitter and the collector. The output voltage in most thermionic generators is a function of the plate or collector (i.e., positive electrode) voltage. When a pickup is present, particularly an inductive pickup, output voltages may become a complex function of the pickup's inductance, the beam current value, and the beam focus. An accelerator grid or anode gun can also play a role.

The viability of a commercial application may depend on the efficiencies of the system. The efficiency of the system is expressed as that percentage of thermal energy converted to 1) electron emissions, 2) transmission of those emissions to a collector for usable electrical power, and 3) loss of thermal energy into the surroundings. The amount of thermal energy emission itself depends chiefly on three factors: the temperature of the emissive cathode, its work function, and its physical surface properties. Emission of any sort takes place as a threshold event and increases as temperature increases, as well as when work function lowers. In the absence of other interventions, emissions occur in a statistically random manner, with electrons traveling in directions that impede efficiency.

Research has been done to improve the work functions of the emitters and collectors used in thermionic converters, as well as creating schemes to improve the power densities by reducing the space charge effects between the cathode and anode. For example, a collector/anode made from similar materials may be held at a cooler temperature nearby the emitter, and the emitted electrons begin to condense on the surface of the collector. These electrons supply electrical power by flowing through an electrical load that connects both the emitter and the collector.

Fine screens have also been employed to create a positively charged gate above the collector that works to neutralize the space charge caused by the emitted electrons. These so called 'gated' thermionic converters still suffer from losses due to secondary emissions at the anode, electron emissions traveling into the gate structure, as well as thermal losses, and may be limited to DC power outputs at voltages below 1.0 V for each cathode and anode pair.

Control Over Electron Emission

The presently described systems and techniques controls emissions using kinetic, electrostatic, and magnetic effects. A positively charged electrode, which serves as an acceleration grid, attracts the negatively charged electrons. A secondary negatively charged electrode controls the flow of these electrons. Together these positive and negative electrodes result in a tightly packed wave consisting of a volume of negatively charged electrons that moves at accelerated speed from the emission site. This rising wave of charge creates a magnetic field in its wake, as well as interacts with its surroundings by way of electrostatic potentials. Coupled with an inductive element, whose geometry exploits these local disturbances of the magnetic field, these electromagnetic and electrostatic phenomena can convert the moving electrons' kinetic energy into voltage and/or current.

When the electron beam interacts with the inductor, a magnetic field, as well as a voltage, are generated in the inductive coil which immediately results in current flow as the magnetic field in the coil collapses. The inductive element results in an additional voltage between the cathode and anode. The anode/collector/positive electrode captures the excess energy of the electrons.

To address power density and efficiency issues, the disclosed system and methods may systemically utilize five tightly-integrated structures to create a moving volume of electrons that travels in waveform from the cathode to the anode of the device. This tight packet of electrons constitutes a 'wave' due to its observed output that is characterized as a sudden surge and then fall of the local charge concentration. These five structures include a low work function emitter (cathode), a non-planar low work function collector/anode, a control electrode, an acceleration electrode, and a final element to convert the energy of the electron wave into a desired output voltage. Optionally, an inductive element or an electrostatic pickup (or both) may be used to extract energy from the electrons. Example inductive elements include inductors and example electrostatic pickups include multi-stage collectors, such as multi-stage depressed collectors.

An inductive element advantageously address two important issues: low voltage outputs and secondary emissions. An inductive structure capturing the wave of electrons permits direct manipulation of the output voltage, and results in a higher voltage, mitigation of secondary emissions, and hence more converted power, than the contact potential of the cathode and anode alone. Further, this inductive interaction results in a deceleration of the electron wave and thus reduces the possibility of reflective secondary emissions when the wave encounters the anode. In addition, the calculated and software-simulated, non-planar geometry of the anode increases the recapture probability of secondary emissions, when present.

Use of the inductive element may employ a cycle of wave-pulses, achieved by modulating the voltage in the acceleration and control grid electrodes. Pulsed modulation techniques of the duty cycle of this signal can effectively produce any AC frequency of choice, including an alternating output voltage of 60 Hz, making the TWG an ideal backend converter for close integration with existing power applications. Wafer fabrications techniques permit the TWG to achieve both the structures and the precise, micron-scale features and placements of these structures.

Thermionic Wave Generators

Referring to FIG. 1, a schematic illustration of the subassemblies of an example thermionic wave generator (TWG) 100 is shown, indicating how some embodiments of the fabrication can occur. Cost-Efficient fabrication may be achieved by using wafer fabrication techniques to build the complex and high precision components of the TWG 100, for example. Other embodiments can include electrode elements that are even further integrated with either the cathode, the anode, or the packaging itself. Advantageously, the core components of TWG 100 are placed inside of an evacuated and hermetically sealed package with electrical terminals connecting the internal electrodes to the exterior of the device.

The TWG 100 may include a cathode 105, a control grid assembly 110, and a pickup electrode and anode 115. A packaging may enclose various components of TWG 100 and be assembled as multiple pieces with a sealing arrangement to separate the Internal environment from the external environment. Packaging may include first packaging 120

(e.g., arranged for housing the cathode 105) and second packaging 125 (e.g., arranged for housing the pickup electrode and anode 115). First packaging and second packaging may come together to seal the TWG 100. One or more electrical terminals may 130 be positioned outside of the housing to provide for electrical conduction to external components, with a feedthrough configuration (not shown in FIG. 1) provided for making electrical connections between the one or more electrical terminals 130 and the cathode 105, the control grid assembly 110, the pickup electrode and anode 115, and/or other components within the packaging.

Figure 2:
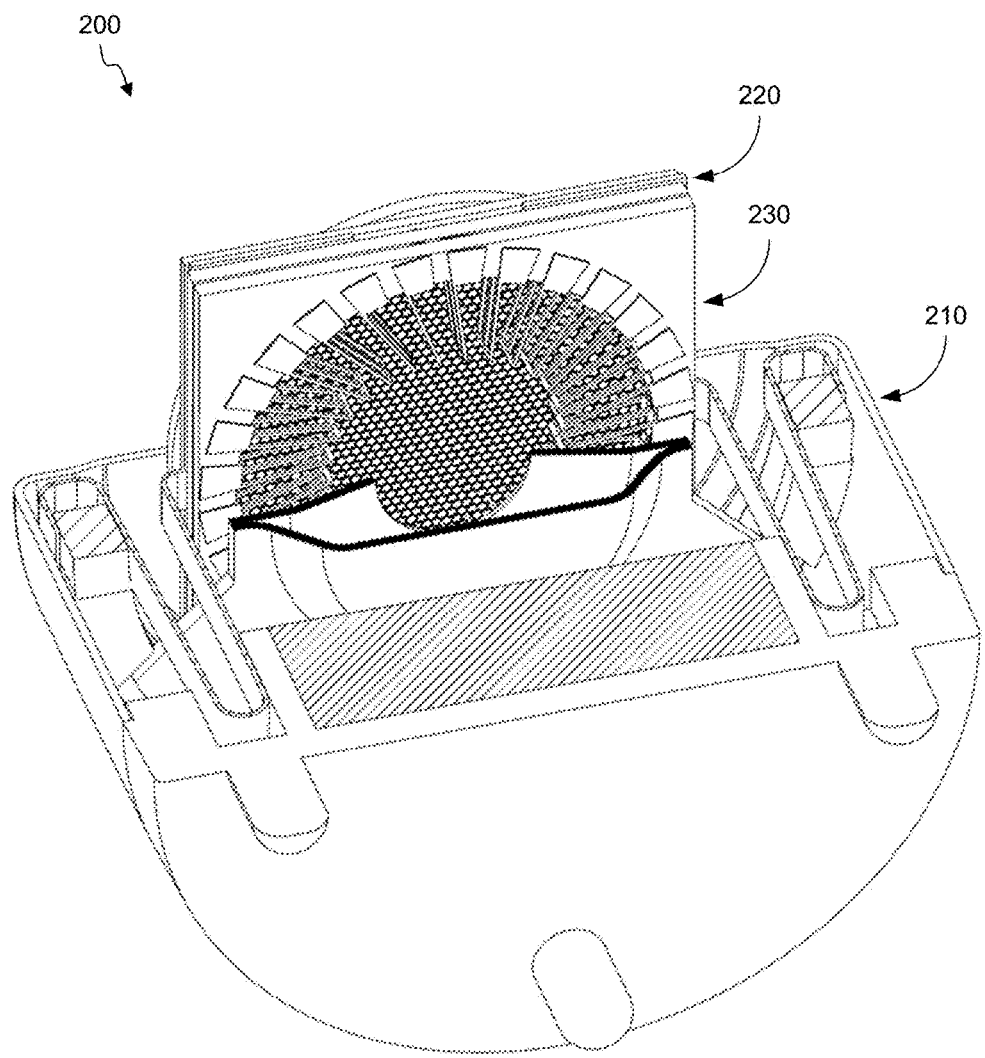
FIG. 2 provides a schematic illustration showing a single TWG device used for direct energy conversion. The figure is cut to reveal various internal components.
Figure 3:
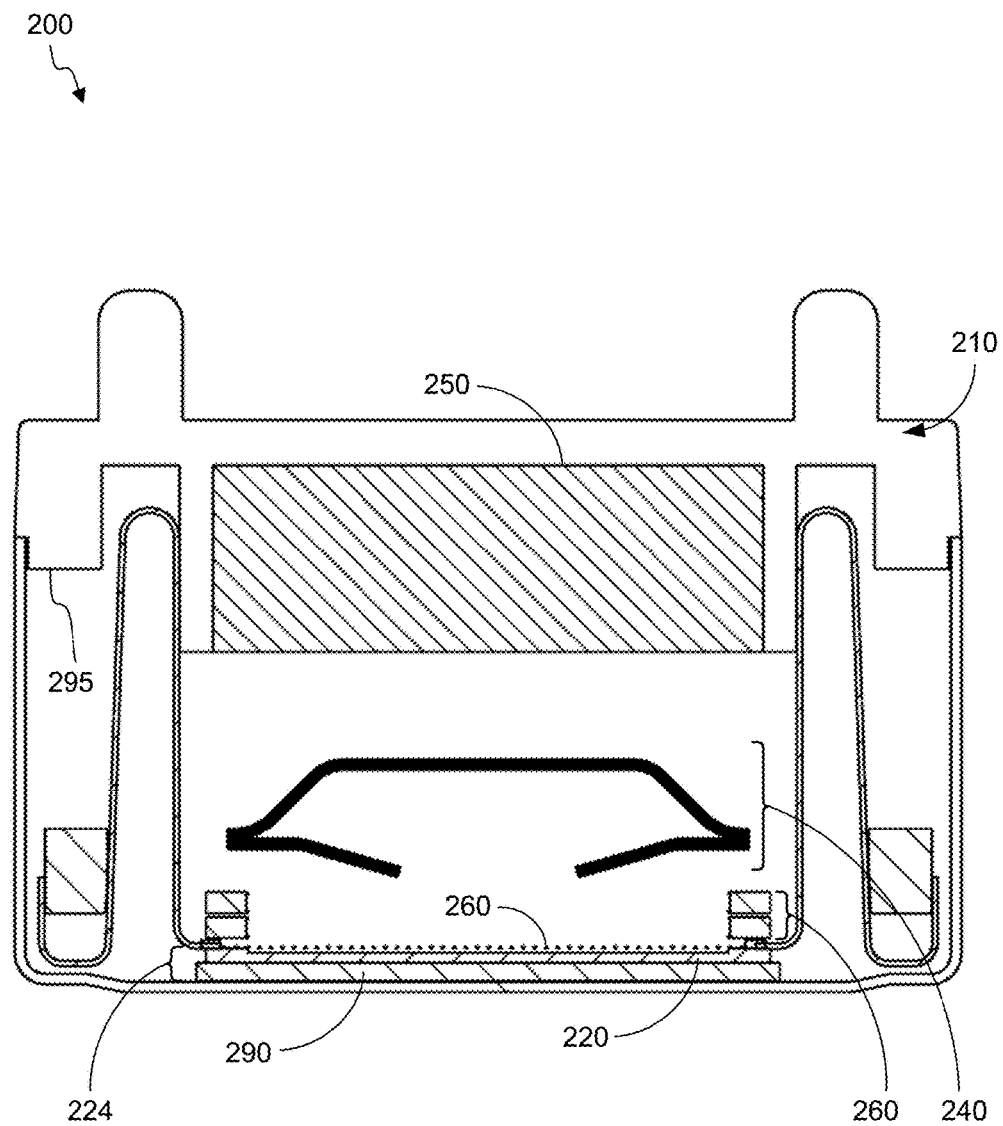
FIG. 3 provides a schematic illustration of a TWG device in closer detail, showing relative locations of various components.

Referring to FIG. 2 and FIG. 3, which provides schematic illustrations of an example TWG 200 in a cutaway and a cross-sectional view, the TWG 200 can be broken down into three major sub-systems. The TWG's packaging 210 seals the internal elements of the TWG from the surroundings, while also creating the structure needed to mount electrical conductors, electrical insulators, and permanent magnets, for example. The inside of the TWG is evacuated to create a high vacuum of below or about $10^{-5}$ Torr, such as from $10^{-7}$ Torr to $10^{-12}$ Torr, or generally below $10^{-11}$ Torr. A cathode 220 is mounted on the 'bottom' of the TWG 200 and is positioned to receive radiant thermal energy, such as from a combustion chamber. As a result, the cathode 220 may reach temperatures from about 500° C. to about 1100° C.

Figure 4:
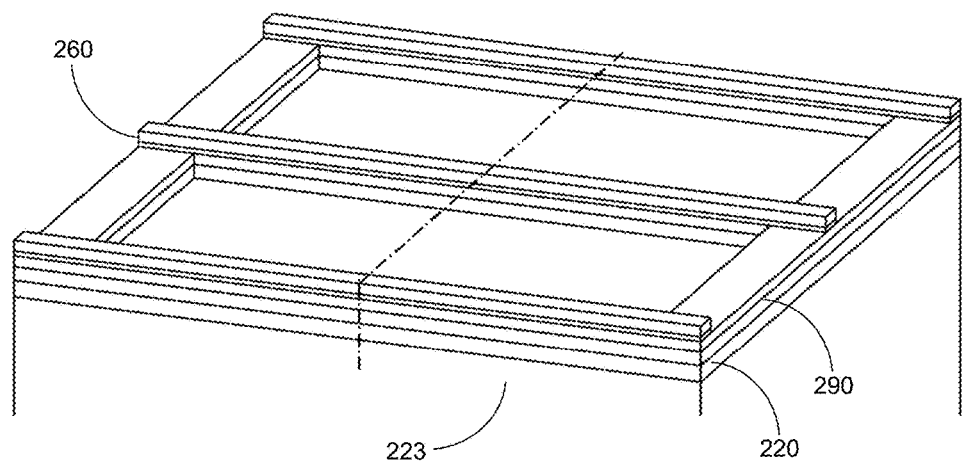
FIG. 4 provides a schematic illustration of a 3D view of control grid and acceleration grid electrodes.
Figure 5:
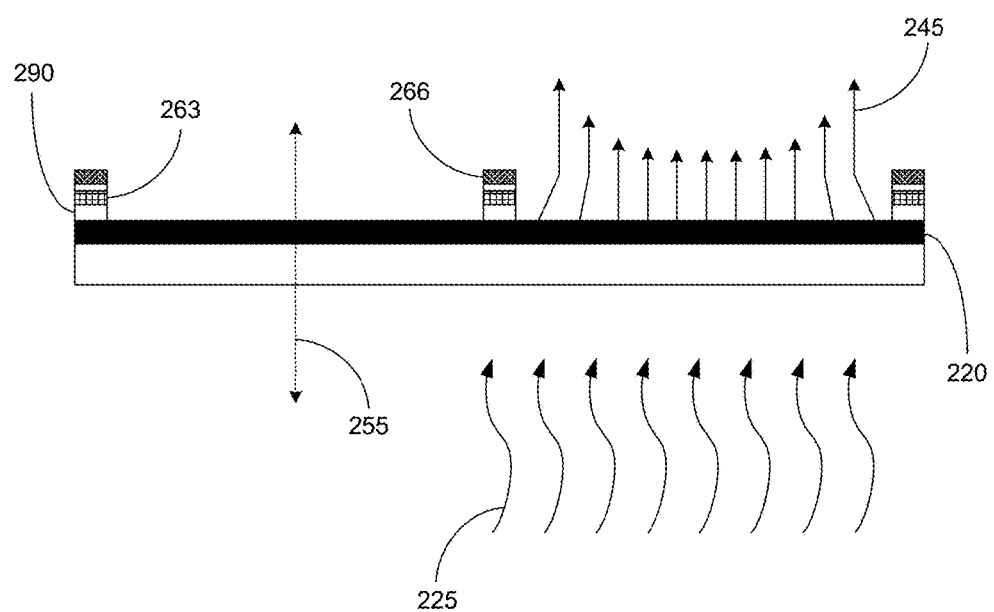
FIG. 5 provides a cross-sectional view of the control grid and acceleration grid electrodes.

A system of electrodes 230 comprises a control grid, acceleration grid, inductive element, and anode. These parts work with the cathode 220 to neutralize the space charge effects of the emitted electrons and focus the electron wave into a width that can pass through an inductive element, without making direct contact. The control grid functions to reduce the loss of emitted electrons into the acceleration grid and to compact the local electron cloud into a narrower column forms an element of the electron wave. FIG. 4 and FIG. 5 depicts schematic perspective and cross-sectional illustrations of the cathode 220 and control grid assembly 260, showing the arrangement of the separate electrode components. Optionally, cathode 220 may be supported by a cathode substrate 223. Control grid assembly 260 is illustrated as including openings for passing the electron wave emitted by the cathode 220. Control grid assembly 260 is illustrated in FIG. 5 as including a control grid 263 (also referred to herein as a control grid electrode) and an acceleration grid 266 (also referred to herein as an acceleration grid electrode). The direction of magnetic field lines generated by magnet 250 are indicated by element 255. Radiant thermal energy may be received by a bottom side of TWG 200 and transferred to cathode 220, as indicated by elements 225. Average trajectories of electrons that comprise the wave are indicated by elements 245.

Figure 6A:
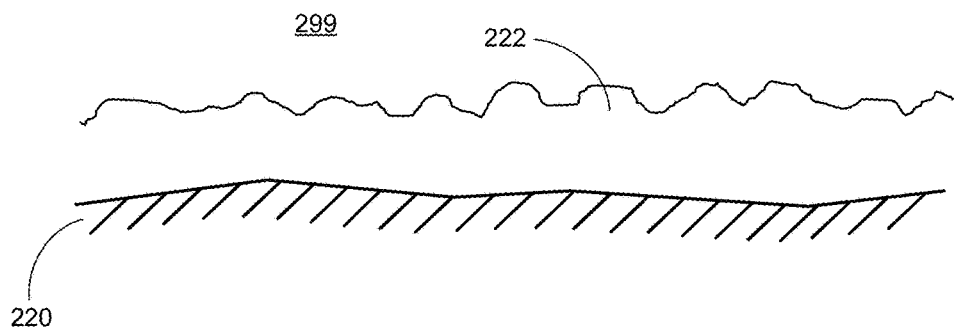
FIG. 6A and FIG. 6B provide a schematic illustrations of a film used for a smooth cathode surface and an etched cathode surface.
Figure 6B:
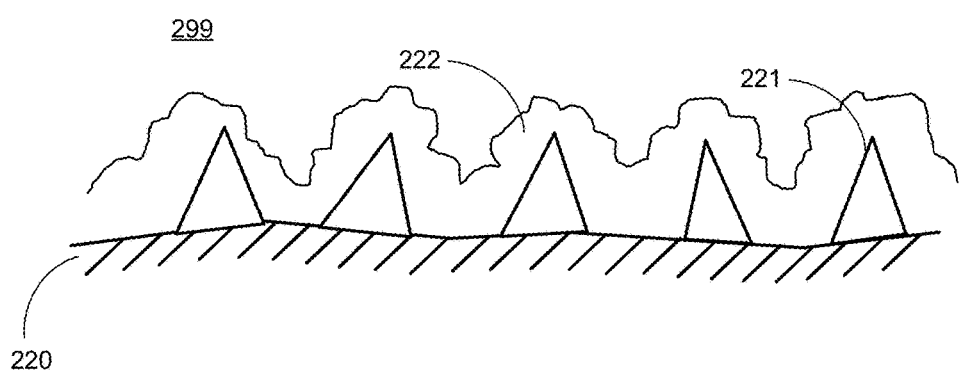

The cathode 220, also known as an emitter, may comprise, consist of, or consist essentially of an etched surface that features a dense array of micro-tips and edges with aspect ratios (e.g., height to edge width) greater than 4:1. A schematic view of a cathode 220 without micro-tips is illustrated in FIG. 6A and a schematic view of a cathode 220 with micro-tips 221 is illustrated in FIG. 6B. These tips 221 and edges focus and improve the electron emission by increasing the local electric field intensity. This local electric field reduces the energy barrier of the emitter and permits emission at energies below those required to overcome the work function of the material of cathode 220. The cathode 220 is typically made from a MoCu wafer but can use other refractory alloys in other embodiments. The surface of cathode 220 is coated with an emissive carbon composite coating 222, which may be amorphous. This composite coating 222 may comprise a nano-diamond film that is deposited with chemical vapor deposition (CVD) to produce a mostly non-crystalline, low work function surface that supports large charge concentration. In other fabrication methods, especially at smaller scales, atomic layer deposition (ALD) takes the place of CVD. The high vapor phase transition temperature 1 of carbon slows the degradation of the emitter's surface properties, resulting in a reliable high-temperature electron emitter. Various dopants including hydrogen, nitrogen, and/or boron may be used within the coating to enhance the electron flow within the carbon matrix. The collector or anode 240 of the TWG 200 may also coated with this or another carbon composite coating to reduce its surface work function. A vacuum gap 299 separates the cathode 220 from the anode 240.

A control grid assembly 260 shapes electron emissions from the cathode 220. Embodiments of control grid assembly 260 may optionally include both a negatively charged control grid 263 and a positively charged acceleration grid 266. The electric potential created by acceleration grid 266 may accelerate low-energy electrons near the cathode 200 while also reducing the energy barrier for additional electrons within the cathode 220. A negatively charged control grid 263 placed directly between the acceleration grid 266 and the cathode 220 may deflect electrons away from the positively charged acceleration grid 266 in such a way as to mitigate leakage currents. Voltages on the acceleration grid 266 may be time-varying, such as from 0 V to 30 V, and the control grid 263 may also have a time-varying potential, such as varying from 0 V to −1 V, with voltages optionally referenced to the potential of cathode 220. Such voltages may advantageously result in grid leakages below 10%. As illustrated with respect to FIG. 9, the current density of the TWG 200 may be closely related to the space charge limited current as expressed with the Child-Langmuir equation. To account for acceleration grid's spacing from the cathode as well as leakage/loss, current density [Amps/cm$^2$] may be modeled as $$J_{TWG} = (1-r)2.335 \times 10^{-6} \frac{(\mu V_g + V)^{\frac{3}{2}}}{x_g^2},$$

where V is the contact potential between the cathode 220 and anode 240, $V_g$ is the acceleration grid voltage, r is a reflectance factor caused by secondary emissions, and $x_g$ is the distance the acceleration grid 263 is from the cathode 220. Maximum current may be determined, for example, by Richardson's law, $J_{RD}=AT^2 e^{-\emptyset/kT}$.

Figure 9:
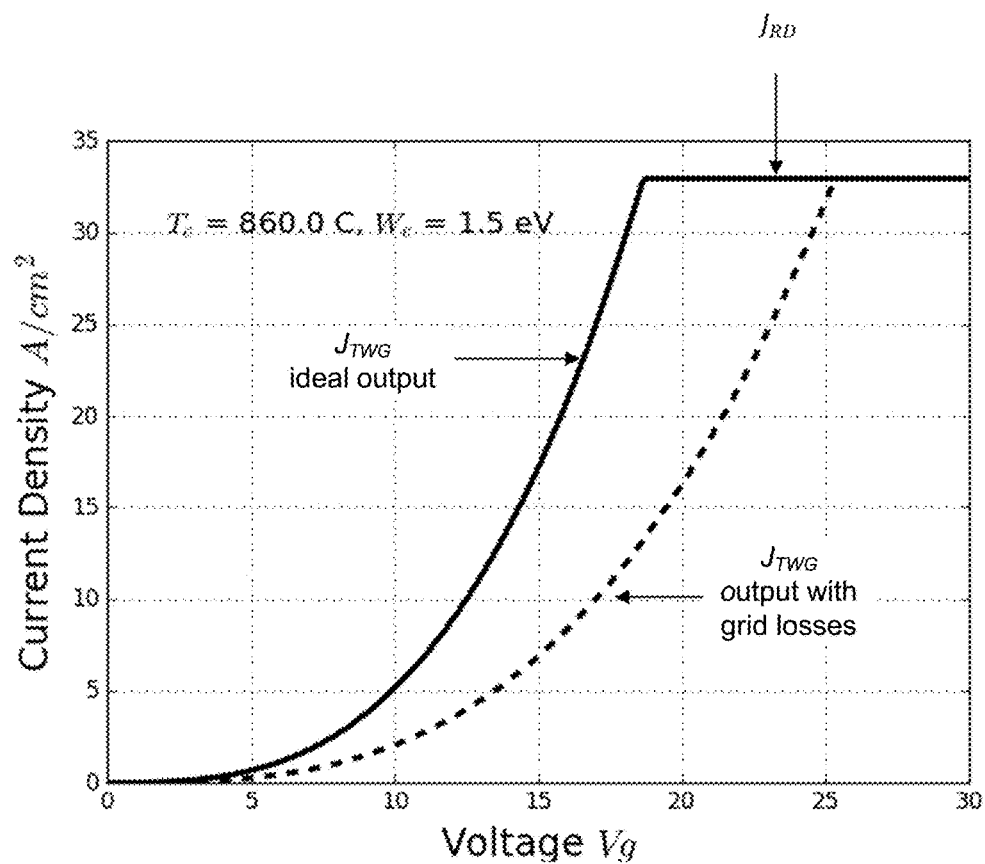
FIG. 9 provides a plot showing current density for a TWG with both an ideal grid (grid losses absent) and a grid with loss factors included.

In FIG. 9, the plot shows example current density for a TWG with both an ideal (loss free) grid and a grid with loss factors included. The plot demonstrates that space charge neutralization occurs within the TWG, and that maximum current densities are limited to the cathode's material and surface properties.

Figure 10:
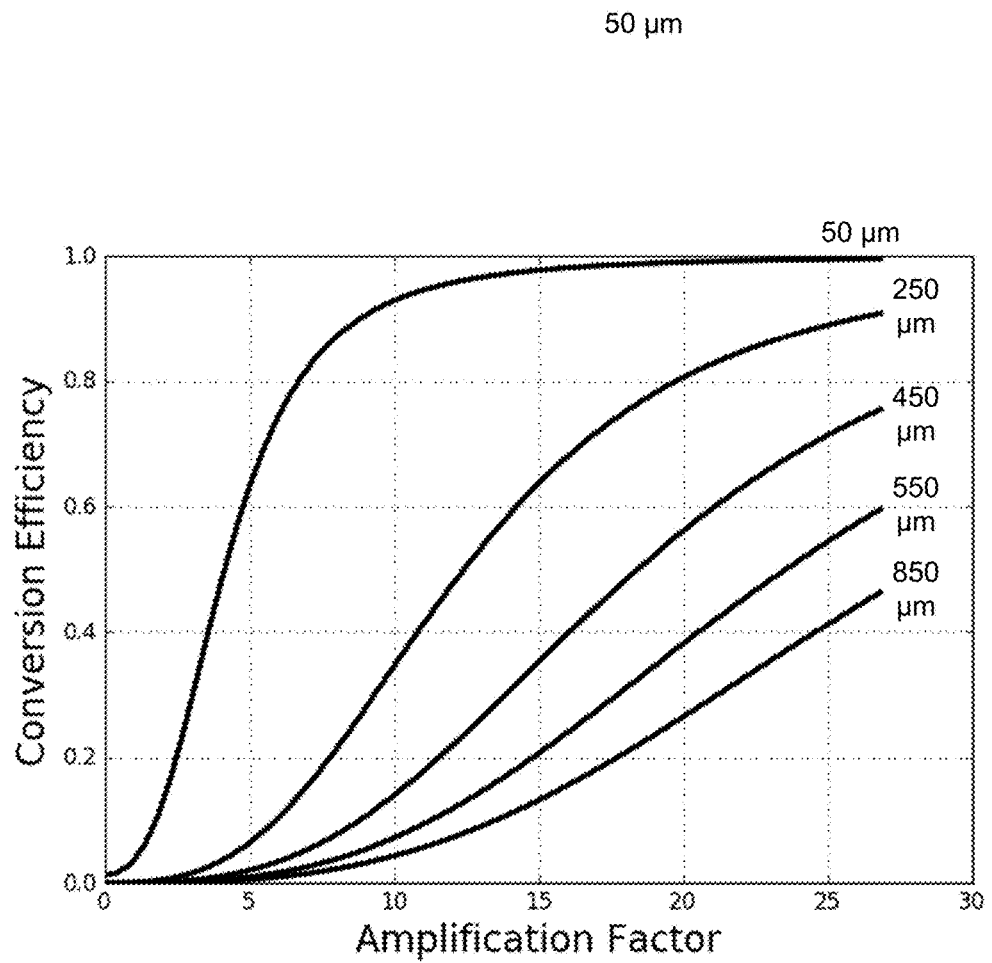
FIG. 10 provides a plot showing conversion efficiency for a TWG with varying acceleration grid distances.

FIG. 10 provides a plot of example conversion efficiency for a TWG with varying acceleration grid distances. Grid current leakage is assumed to be zero for all of the displayed plots. The plots illustrate the advantage of smaller grid distances in achieving high conversion efficiencies.

In some embodiments, the voltage of the acceleration grid 266 may be modulated using a square wave signal with a frequency of from about 1 to 10 kHz. While the signal of the square wave is 'low', the acceleration grid voltage is zero, and the control grid 263 prohibits the transmission of the electron wave. When the signal of the wave is 'high', the positive acceleration grid 266 is activated and generates an instantaneous acceleration of the emitted electrons. This action forms the electron wave with electrical current $I_w$, and subsequently sends the moving wave at speeds fast enough to create the appearance of an instantaneous current that follows the same frequency, phase, and duty cycle of the square wave, as illustrated with respect to FIG. 11, FIG. 12, and FIG. 13. In embodiments, this frequency-driven electron emission, referred to herein as an electron wave, interacts primarily magnetically with the inductive element 280 to produce a voltage across a resistive load, $R_{load}$, or between the anode 240 and the cathode 220.

Figure 11:
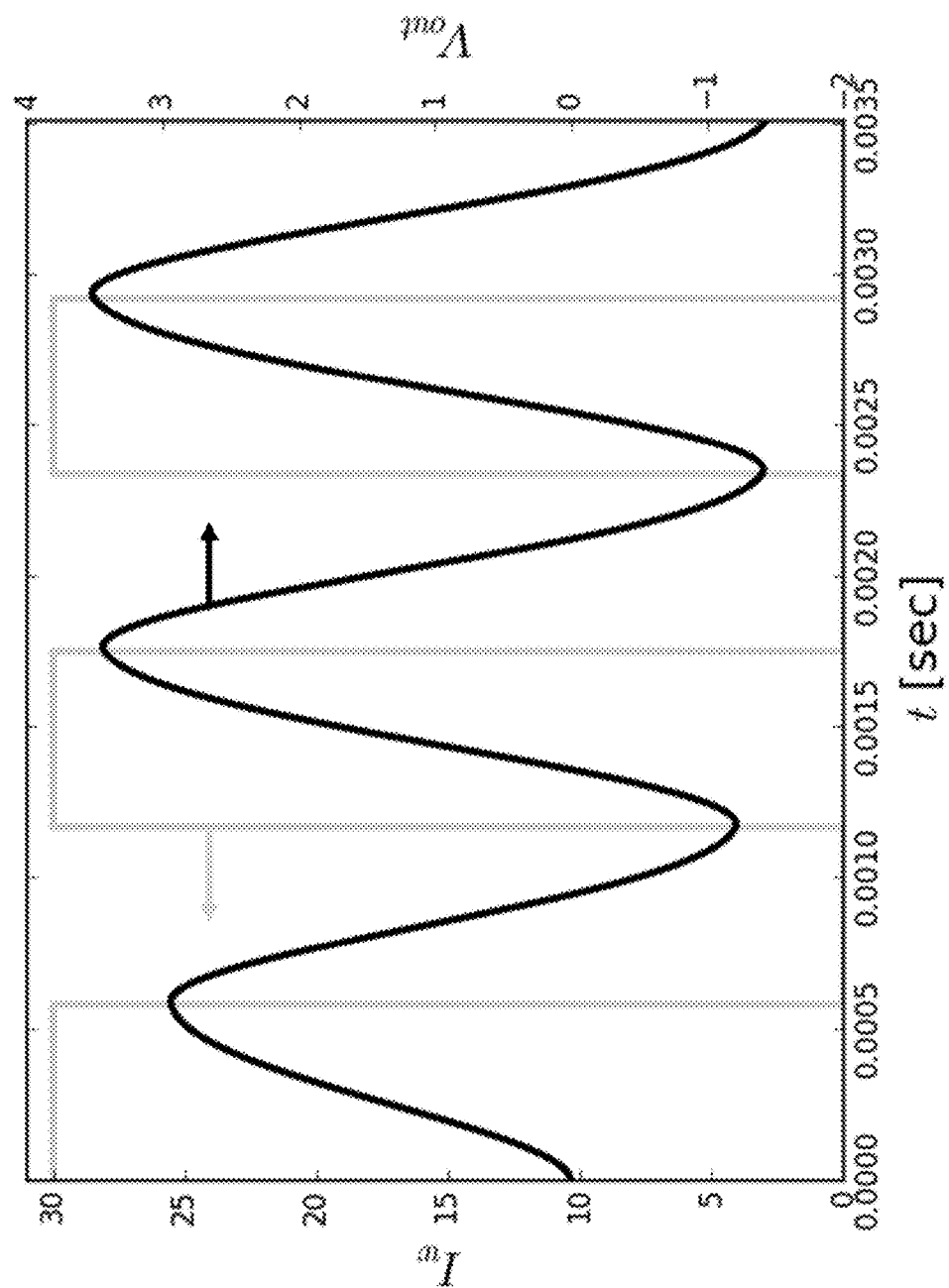
FIG. 11 provides a plot showing simulated voltage output from a TWG device extracting power from an inductive element over time in response to a current.

For example, FIG. 11 depicts plot of simulated voltage output (black curve, right y-axis) from a TWG device extracting power from the inductive electrode over time. In certain embodiments, the acceleration grid is switched on and off with a frequency of 854 Hz, resulting in the square waveform of the TWG's electron wave current, $I_\omega$ (grey curve, left y-axis). The voltage Vow is the response from the inductive electrode interacting to the current $I_\omega$. The inductive element's response to current $I_\omega$ can be modified by changing the acceleration grid's frequency, the inductance of the electrode, the capacitance of the electrode, and the resistance of the applied load. The wave may also be slowed by the interaction with the inductive electrode, and may advantageously result in a reduction in secondary emissions from the anode. As a consequence, the TWG may converge towards an overall conversion efficiency that is not limited to the Carnot efficiency.

Figure 12:
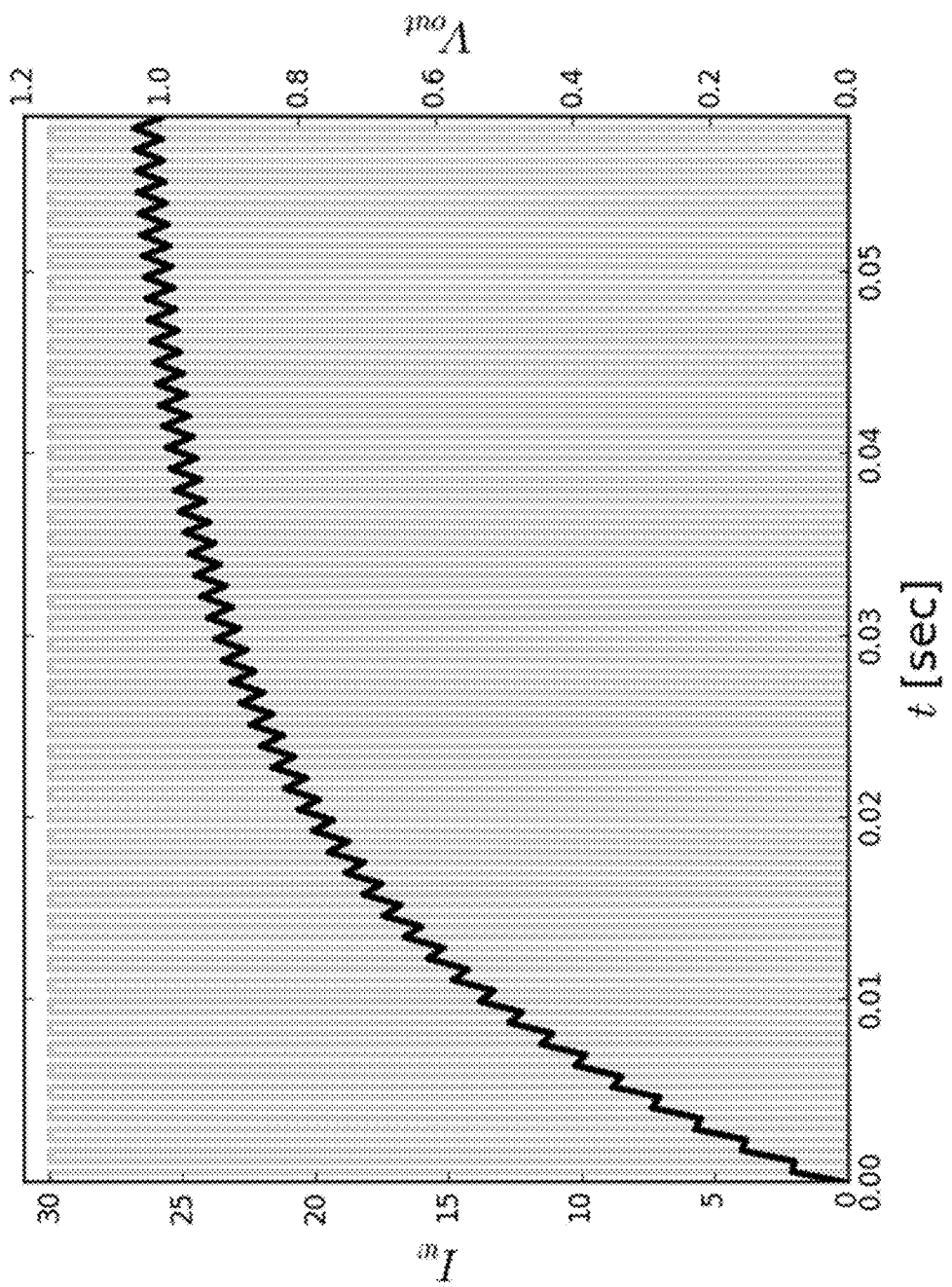
FIG. 12 provides a plot showing simulated voltage output from a TWG device over a longer period of time.

FIG. 12 shows an example plot of simulated voltage (black curve, right y-axis) from a TWG device over a large time scale, with electron wave current also shown (grey curve, left y-axis). In this instance the output from the inductive coil converges to an apparent DC output with 1.0 volts. 1.0 volts may be higher or significantly higher than the contact potential achieved by conventional thermionic conversion devices.

Figure 13:
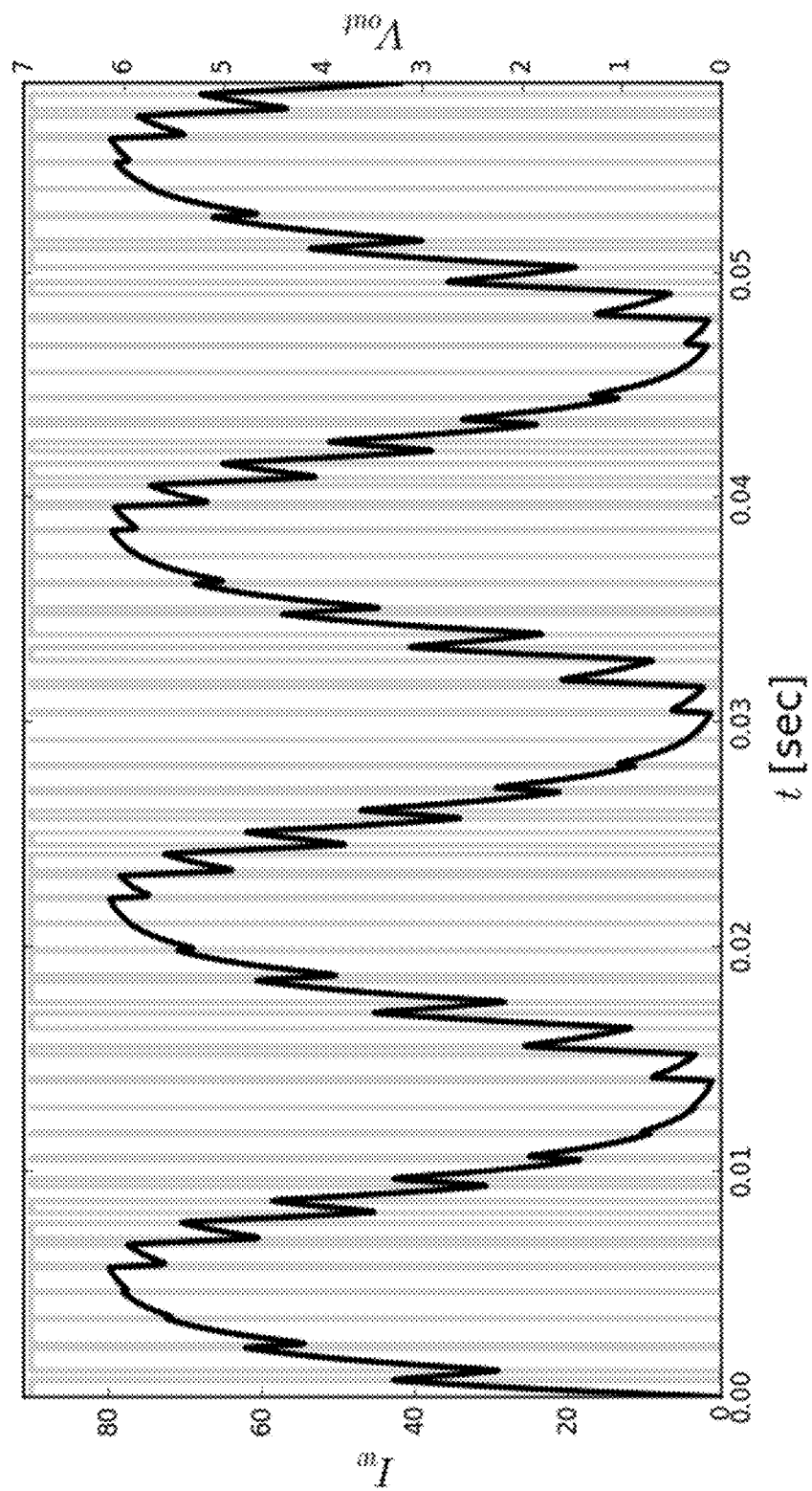
FIG. 13 provides a plot showing simulated voltage output from a TWG device with 60 Hz modulation on the duty cycle of the square wave input into the acceleration grid.

The signal input for the acceleration grid 266 is not limited to square waves, and other embodiments may use sine or triangular waveforms for example. In embodiments, multiplexing techniques or pulse parameter modulation is optionally applied to the input signal. In certain embodiments, a modulation can be a 60 Hz sine wave that varies the duty cycle of a square wave. This additional modulation may produce, for example an alternating output voltage at the inductive element 280 at a frequency of 60 Hz, for example, as illustrated in FIG. 13. FIG. 13 shows an example plot of simulated voltage output (black curve, right y-axis) as in FIG. 12, but with 60 Hz modulation on the duty cycle of the acceleration grid applied, with corresponding electron wave current also shown (grey curve, left y-axis). The resulting voltage output exhibits a 60 Hz sine wave character and illustrates how the acceleration grid electrode can optionally be operated in unique way to directly produce AC power without an external power inverter.

In various embodiments, the space immediately above the control grid assembly 260 is optionally occupied with an additional shaping electrode that may further accelerate and focus the width of the electron emission. This electrode may achieve this through the use of electrostatic forces or magnetic interactions.

A magnetic field created within the inter-electrode gap may serve to keep electrons confined to trajectories that travel in a path from the cathode 220 to the anode 240. A permanent magnet 250 may optionally be positioned above the electrode assembly and supply a magnetic field, with lines running along directions between the cathode 220 and anode 240, as illustrated by element 255 in FIG. 5, that forces electrons to orbit around the field lines to produce a tight spiral. The magnetic field may also advantageously reduce instances of grid leakage. Example magnetic fields may have a field strength of from about 0.02 Tesla to about 0.5 Tesla.

The inductive element 280 may comprise two insulated coupled coils of conductive wire wound upon a hollow bobbin, the coil being enclosed by a cylinder of magnetic material (e.g., a magnetic core) or other architecturally designed magnetic material container that serves to contain flux lines and improve the coupling of the two coils, for example. The first coil may extract energy from the electron wave while the second coil communicates with an external circuit and provides for a transformation ratio that supports voltage step-down and optimal amperage. The second coil optionally remains separated from the first coil and is optionally closer to the collector or anode 240 than the first coil. These coils form an induction element 280 that functions as a transformer or coupled inductors capable of producing voltages that are proportional to the instantaneous change in the electrical current of the electron wave. To maintain this voltage, the inductive element 280 may interact with a frequency-driven current, achieved by modulating the acceleration grid voltage with a high-frequency square wave pulse train from a DC power supply, as described above. FIGS. 11, 12, and 13 illustrate this interaction between electron wave current $I_w$ and the voltage output from the inductive element 280.

Secondary emissions, when present, result in electrons traveling back to the cathode 220. The non-planar shape of the anode 240 may reduce reflectance and secondary emissions from the anode 240. The large area of the anode 240 may enhance the cooling properties of the anode 240, as well. In another embodiment, the anode 240 comprises four non-planar stages, such as with progressively lower negative operating voltages. If these multiple stages are present, this element is designated as a multistage depressed collector. Each stage may exert a braking effect on the electron beam and may extract any residual motive energy not surrendered to the inductive element. Reducing a surface work function of the anode 240 with a carbon composite coating, as described above, may further reduce the chance of secondary emissions. Optionally, this may be used in conjunction with a multistage depressed collector. A multistage depressed collector bears negative charges, for example. A separate ground return circuit returns the electrons in the wave to the emitter. Optionally, the anode 240 may be fabricated as an array of anode sub-elements, with each sub-element individually positioned directly above respective openings in the control grid assembly 260.

The entire TWG 200 may be assembled using an atmospheric brazing process and other hermetic sealing processes. One or more ceramic spacing elements, such as ceramic spacing element 290, may electrically isolate the cathode 220, components of control grid assembly 280, and anode 240. Cathode 220 and supporting elements, such as thermally conductive and or electrically insulating elements (e.g., substrate 223) may be constructed as a cathode assembly 224. Electrical connections may be made using separate conductive materials. Electrical terminals provide conductive paths for the electrodes of TWG 200. Sealing occurs after evacuating all gases from the TWG 200. A film of reactive metal 295 may function as a 'getter' and maintains the vacuum environment inside the TWG 200 during its lifetime.

Figure 8:
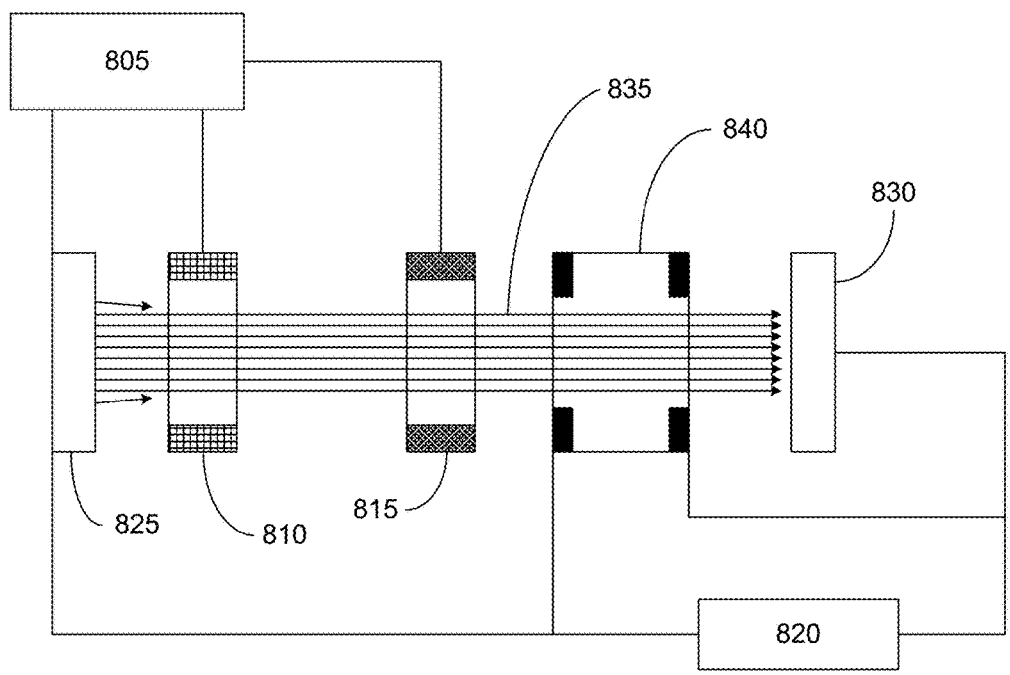
FIG. 8 provides a circuit diagram for a TWG for AC and DC power output modes.

FIG. 8 provides a schematic circuit diagram of a TWG, useful for conversion for both direct current (DC) and alternating current (AC) power output modes. A power supply 805 is used to provide a voltage for the acceleration grid 810 and optionally the control grid 815 relative to the cathode 825. A small amount of energy may be expended in the conversion process by power supply 805. A load 820 represents the output voltage that may be created during the conversion process between the cathode 825 and the cathode 830 by passage of the electron wave 835 through the inductive element 840.

Figure 7A:
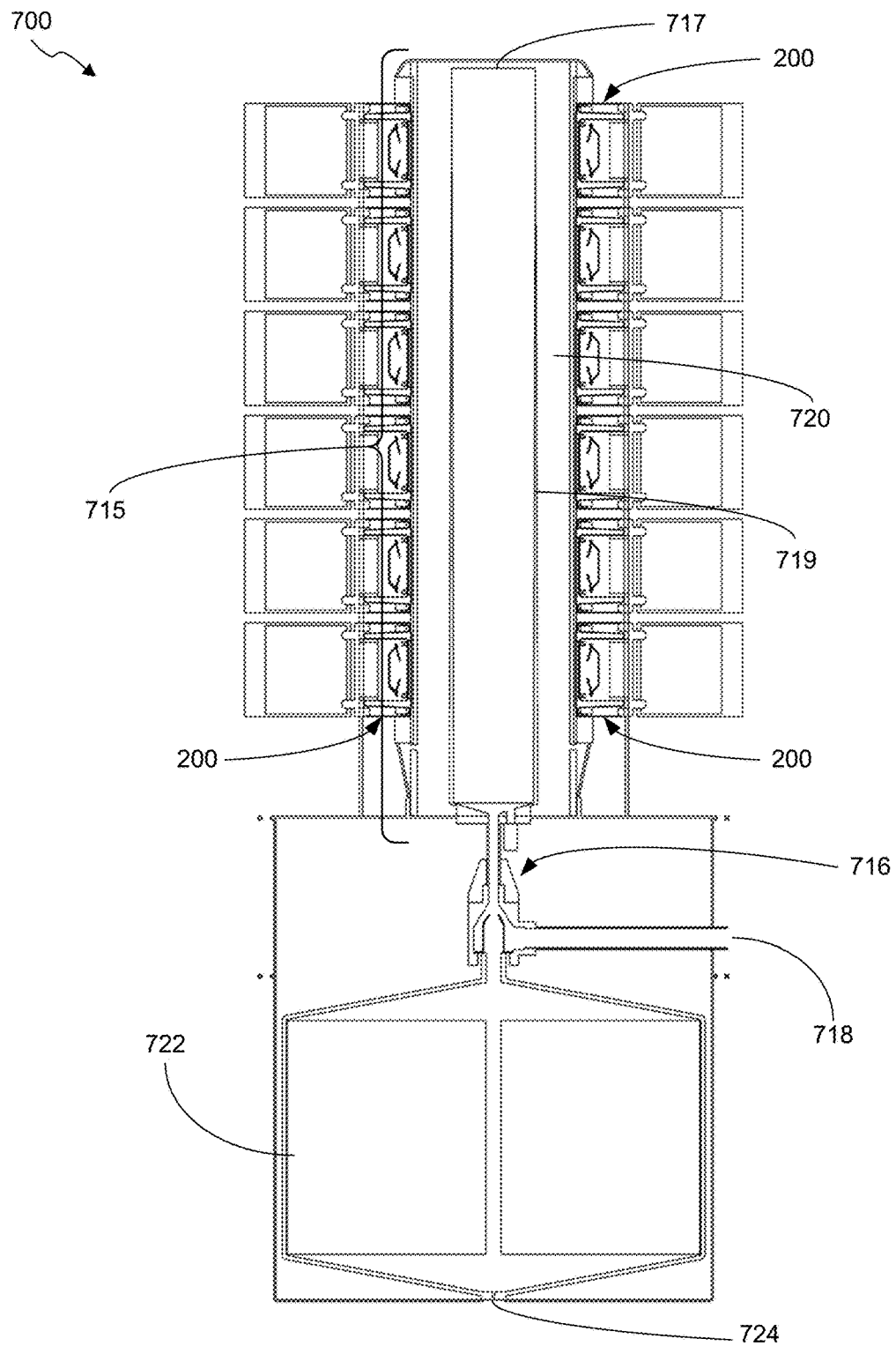
FIG. 7A and FIG. 7B provide schematic illustrations of an embodiment of a TWG integrated within a portable power generator.
Figure 7B:
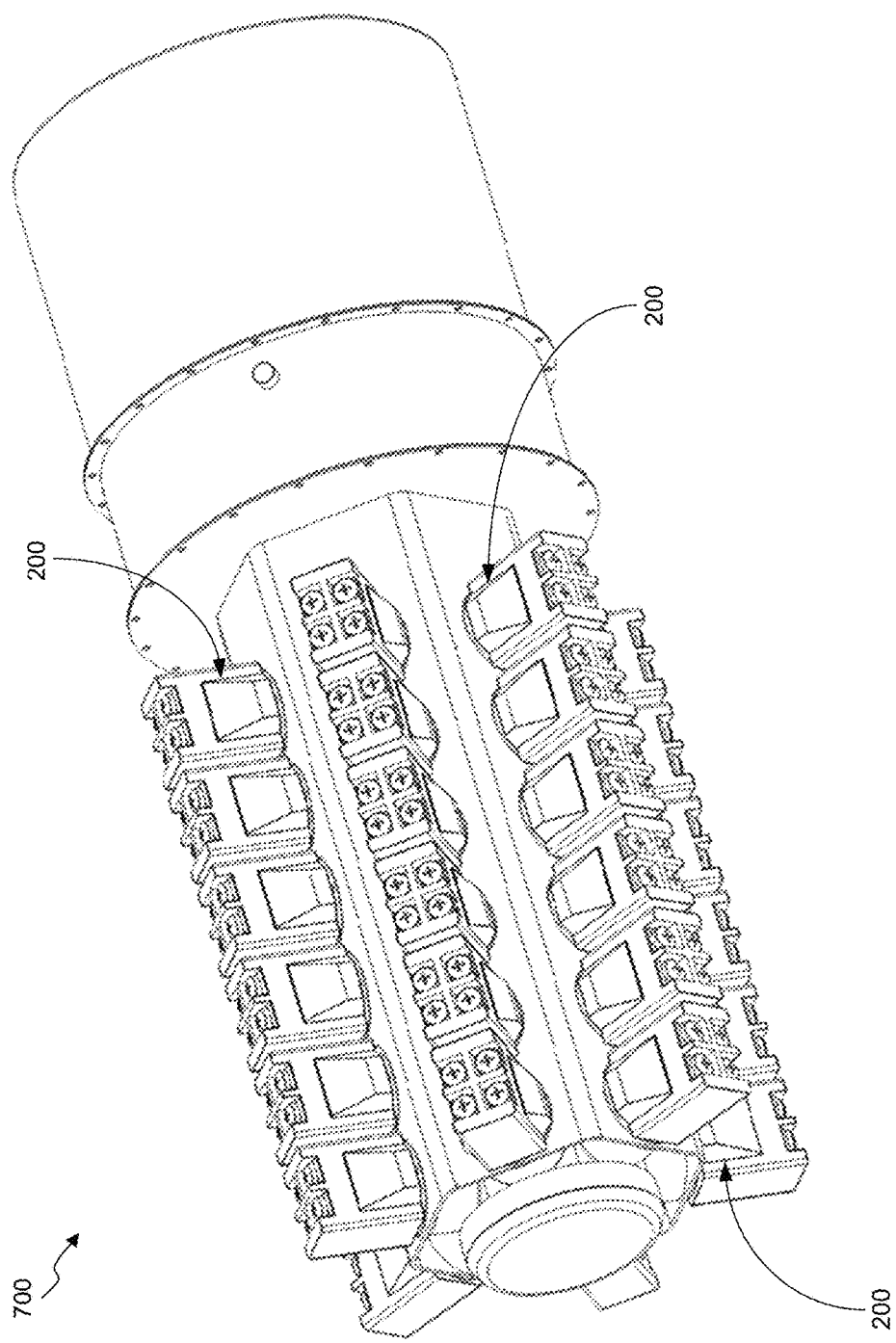

Referring next to FIG. 7A and FIG. 7B, a portable power generator 700 including a plurality of TWGs 200 is illustrated, including a cross-sectional view (FIG. 7A), and perspective view (FIG. 7B). Portable power generator includes a combustor 715, interfacing with TWGs 200 in such a way as to reduce thermal losses to the surroundings. The center of the combustor 715, the 'core' 717, is where the combustion process takes place, and radiant energy travels outwards from the core 717, typically in a radial direction from the center of combustor 715. Fuel is supplied from a storage tank 722. Mixing of fuel and air from inlet 718 occurs within a nozzle assembly 716, and the mixture is ignited inside the core 717. Fuel refilling occurs through a gas port (FIG. 7, ITEM 24). The core 717 is a porous structure, comprising refractory materials placed in the center of the combustor 715. The porous structure evenly distributes the thermal energy of combustion processes while simultaneously burning all possible fuel molecules, for example. During the assembly of the combustor 715, air is evacuated from the space between the core and the housing to form a vacuum gap 720. The combustion chamber is hermetically sealed. Radiative heat transfer dominates energy transfer. Exhaust gases do not enter the vacuum gap and are instead routed out from the core, optionally via a jacket that wraps around the porous media of the core. Optionally, a porous core 717 and jacket assembly is replaced with a vortex combustor that can also achieve high levels of combustion conversion efficiency.

Figure 14:
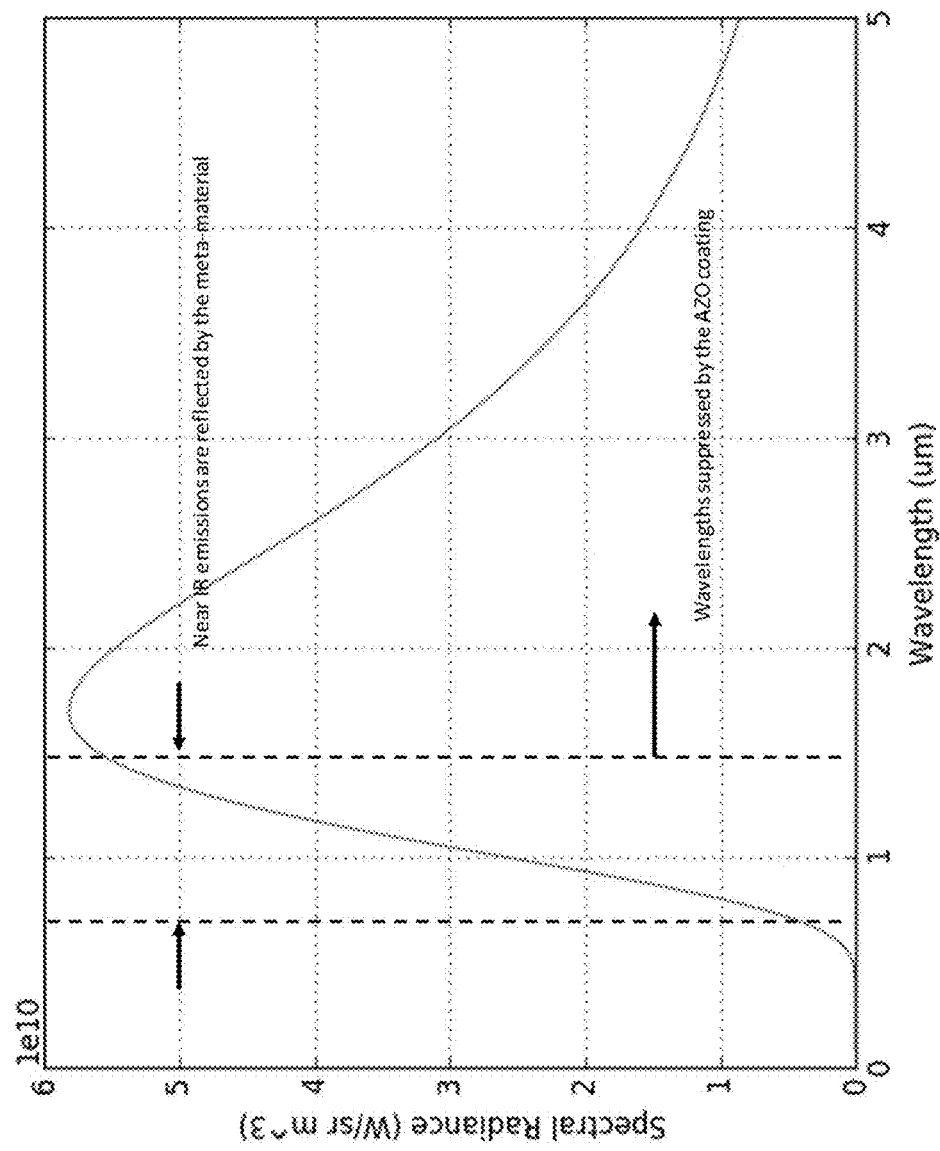
FIG. 14 provides a plot of the spectral radiance from the core of a combustor.

A layer of Aluminum Zinc doped Oxide (AZO) of from about 0.5 mm to about 1.6 mm thick optionally coats the external surface 719 of core 717 to suppress the emissions of far IR spectrum radiation wavelengths, as indicated in FIG. 14, and thus may be useful to reduce the amount of thermal radiation lost to the surroundings. FIG. 14 provides a plot of example spectral radiance form the core of the combustor. The plot features vertical lines indicating where wavelengths of thermal radiance are suppressed or reflected by meta-materials surfaces. Areas of the outer enclosure of portable power generator that do not interface with TWG devices, such as those surrounding core 717 and adjacent to and/or between TWGs 200, optionally include surface etching of a meta-material texture that reflects radiant energy having wavelengths of from about 0.8 μm to about 1.5 μm back to the core. In another embodiment, the radiant energy is reflected towards the locations of TWGs 200 positioned radially from the core 717 of the combustor 715. This is optionally configured using secondary reflectors, photonic crystals, plasmon polariton resonators, and/or waveguides, for example. Such configurations may advantageously produce highly efficient or nearly perfect insulation at areas not involved with supplying the thermal power needed for the operation of TWGs 200.

TWGs 200 are interfaced to the outer housing of the combustor 715. Thermal radiation from the core 717 is absorbed using carbon sheets, for example, of from about 0.5 mm to about 1 mm thick to heat these active areas, such as to temperatures of from 500° C. to 1100° C. To optimize the surface coverage of the TWG 200 on its respective heat source, it is possible to increase the size of a single TWG 200 by increasing the size of the individual wafer parts, resulting in an assembled TWG 200 that is, for example, up to 20 mm in width and up to 300 mm in diameter. In another embodiment, it is possible to shrink the design of TWGs 200 to up to 10 mm in width and up to 500 μm in diameter.

Additionally, the electrical power output of the system can be scaled up by electrically connecting individual TWGs 200. Subsequently, the active areas of combustor 715 can be increased to generate more power from the system. The entire system can range in volume from 0.1 L to 1,000 L of displacement or more, for example.

Combustion chemistry and use of a combustor does not limit the utility of TWGs in conversion of thermal energy to electricity. Other heat sources may be employed, such as concentrated solar, gas turbine engines, rocket engines, and even sub-critical radioactive isotopes, to produce thermal energy for the TWG to harvest. In embodiments, the TWG may produce electrical power without the need for refueling until the isotope, for example, decays in a matter of its respective half-life. Long endurance applications found in space, deep sea, and military mission suit embodiments incorporating radioactive thermal energy generation.

ILLUSTRATIONS

As used below, any reference to a series of illustrations is to be understood as a reference to each of those examples disjunctively.

Illustration 1 is an energy converter comprising: a first electrode for emitting electrons, wherein the first electrode includes a plurality of microtips extending from a base surface of the first electrode, and wherein the first electrode includes an emissive carbon coating over at least a portion of the microtips; a second electrode adjacent to first electrode; a third electrode adjacent to the second electrode, wherein the second electrode is positioned between the third electrode and the first electrode; an inductive element adjacent to the third electrode, wherein the third electrode is positioned between the second electrode and the inductive element; a fourth electrode for collected electrons emitted from the first electrode, wherein the fourth electrode is adjacent to the inductive element, and wherein the inductive element is positioned between the third electrode and the fourth electrode; and a housing defining an enclosed evacuated volume, wherein the first electrode, the second electrode, the third electrode, the inductive element, and the fourth electrode are positioned within the enclosed evacuated volume.

Illustration 2 is the energy converter of any previous or subsequent illustration, wherein the first electrode comprises a cathode.

Illustration 3 is the energy converter of any previous or subsequent illustration, wherein the first electrode has a lower potential than the fourth electrode.

Illustration 4 is the energy converter of any previous or subsequent illustration, wherein the first electrode comprises a material having a work function of from about 0.25 eV to about 3 eV.

Illustration 5 is the energy converter of any previous or subsequent illustration, wherein the first electrode comprises a crystalline ceramic electride or wherein the first electrode comprises a crystalline ceramic electride coating.

Illustration 6 is the energy converter of any previous or subsequent illustration, wherein the plurality of microtips exhibit a first cross-sectional dimension at the base surface of the first electrode and a smaller cross-sectional dimension at a distance from the base surface.

Illustration 7 is the energy converter of any previous or subsequent illustration, wherein the plurality of microtips exhibit a height to width ratio of from about 4 to about 10.

Illustration 8 is the energy converter of any previous or subsequent illustration, wherein the plurality of microtips exhibit cross-sectional or height dimensions of from 50 nm to 100 µm.

Illustration 9 is the energy converter of any previous or subsequent illustration, wherein the plurality of microtips comprise vertically arrayed carbon nanotubes, diamondoids, or alkaline metal oxides.

Illustration 10 is the energy converter of any previous or subsequent illustration, wherein the first electrode is fabricated using one or more microfabrication techniques.

Illustration 11 is the energy converter of any previous or subsequent illustration, wherein the first electrode is deposited onto a MoCu alloy substrate, and wherein the first electrode has a thickness of from 10 nm to 20 µm.

Illustration 12 is the energy converter of any previous or subsequent illustration, wherein the emissive carbon coating comprises a doped or undoped amorphous carbon coating.

Illustration 13 is the energy converter of any previous or subsequent illustration, wherein the emissive carbon coating comprises a doped or undoped nanodiamond coating.

Illustration 14 is the energy converter of any previous or subsequent illustration, wherein the emissive carbon coating is doped with one or more of hydrogen, nitrogen, or boron.

Illustration 15 is the energy converter of any previous or subsequent illustration, wherein the emissive carbon coating is deposited using a chemical vapor deposition process or a physical vapor deposition process.

Illustration 16 is the energy converter of any previous or subsequent illustration, wherein the first electrode has a surface area of from 0.05 $cm^2$ to 16 $cm^2$.

Illustration 17 is the energy converter of any previous or subsequent illustration, wherein the first electrode comprises a refractory metal.

Illustration 18 is the energy converter of any previous or subsequent illustration, wherein the second electrode comprises a control grid electrode.

Illustration 19 is the energy converter of any previous or subsequent illustration, wherein the second electrode has a potential that varies as a function of time.

Illustration 20 is the energy converter of any previous or subsequent illustration, wherein the second electrode has a lower potential than the first electrode.

Illustration 21 is the energy converter of any previous or subsequent illustration, wherein the second electrode is electrically connected to the first electrode.

Illustration 22 is the energy converter of any previous or subsequent illustration, wherein the second electrode comprises a grid electrode or electrode array having electrode elements arranged in a grid configuration.

Illustration 23 is the energy converter of any previous or subsequent illustration, wherein the second electrode, the third electrode, or both, covers up to 30% of a surface area of the first electrode, and wherein 70% or more of the surface area of the first electrode is exposed through apertures or spacing regions of the second electrode, the third electrode, or both.

Illustration 24 is the energy converter of any previous or subsequent illustration, wherein the first electrode emits electrons that pass through apertures or spacing regions of the second electrode.

Illustration 25 is the energy converter of any previous or subsequent illustration, wherein a potential applied to the second electrode modulates a current of electrons between the first electrode and the fourth electrode.

Illustration 26 is the energy converter of any previous or subsequent illustration, wherein a potential applied to the second electrode focuses electrons between the first electrode and the fourth electrode.

Illustration 27 is the energy converter of any previous or subsequent illustration, wherein the first electrode, the second electrode, the third electrode, and/or the fourth electrode is fabricated using one or more microfabrication techniques.

Illustration 28 is the energy converter of any previous or subsequent illustration, wherein the second electrode is fabricated by patterning layers of conductive and insulating materials in a grid arrangement.

Illustration 29 is the energy converter of any previous or subsequent illustration, wherein the second electrode is separated from the first electrode by an inter electrode spacing of from 5 µm to 400 µm.

Illustration 30 is the energy converter of any previous or subsequent illustration, wherein the third electrode comprises an acceleration grid electrode.

Illustration 31 is the energy converter of any previous or subsequent illustration, wherein the third electrode has a potential that varies as a function of time.

Illustration 32 is the energy converter of any previous or subsequent illustration, wherein the potential has a square wave modulation with a frequency of from 1 kHz to 1 MHz.

Illustration 33 is the energy converter of any previous or subsequent illustration, wherein the potential has a sinusoidal modulation with a frequency of from about 25 Hz to about 400 Hz.

Illustration 34 is the energy converter of any previous or subsequent illustration, wherein the third electrode has a higher potential than the first electrode.

Illustration 35 is the energy converter of any previous or subsequent illustration, wherein the first electrode emits electrons that pass through apertures of the third electrode.

Illustration 36 is the energy converter of any previous or subsequent illustration, wherein a potential applied to the third electrode modulates a velocity of electrons passing through apertures of the third electrode.

Illustration 37 is the energy converter of any previous or subsequent illustration, wherein a potential applied to the third electrode focuses electrons passing through apertures of the third electrode.

Illustration 38 is the energy converter of any previous or subsequent illustration, wherein the third electrode is fabricated using one or more microfabrication techniques.

Illustration 39 is the energy converter of any previous or subsequent illustration, wherein the inductive element comprises an air core inductor.

Illustration 40 is the energy converter of any previous or subsequent illustration, wherein the inductive element comprises an air core solenoid.

Illustration 41 is the energy converter of any previous or subsequent illustration, wherein the inductive element comprises a solid core inductor.

Illustration 42 is the energy converter of any previous or subsequent illustration, wherein the inductive element comprises a toroidal core inductor or a pot core inductor.

Illustration 43 is the energy converter of any previous or subsequent illustration, wherein the first electrode emits electrons that pass through a central opening of the inductive element.

Illustration 44 is the energy converter of any previous or subsequent illustration, wherein electrons passing through an opening of the inductive element induce a current in the inductive element, induce a voltage across the inductive element, and are decelerated by interactions with the inductive element.

Illustration 45 is the energy converter of any previous or subsequent illustration, wherein the inductive element comprises a conductive material arranged in a coil shaped geometry, a planar spiral geometry, a zig-zag geometry, or any combination of these.

Illustration 46 is the energy converter of any previous or subsequent illustration, wherein the fourth electrode has a non-planar geometry.

Illustration 47 is the energy converter of any previous or subsequent illustration, wherein the fourth electrode comprises a material having a work function between about 0.25 eV and about 2.5 eV.

Illustration 48 is the energy converter of any previous or subsequent illustration, wherein the fourth electrode comprises a plurality of stages.

Illustration 49 is the energy converter of any previous or subsequent illustration, wherein the fourth electrode comprises an array of collector elements.

Illustration 50 is the energy converter of any previous or subsequent illustration, wherein the collector elements in the array are individually positioned above openings within the second electrode and the third electrode.

Illustration 51 is the energy converter of any previous or subsequent illustration, wherein the fourth electrode has a second emissive carbon coating.

Illustration 52 is the energy converter of any previous or subsequent illustration, wherein the second emissive carbon coating comprises a doped or undoped carbon coating.

Illustration 53 is the energy converter of any previous or subsequent illustration, wherein the second emissive carbon coating comprises a doped or undoped nanodiamond coating.

Illustration 54 is the energy converter of any previous or subsequent illustration, wherein the fourth electrode comprises one or more recessed regions or one or more raised regions.

Illustration 55 is the energy converter of any previous or subsequent illustration, wherein the enclosed evacuated volume has a pressure of from $10^{-5}$ Torr to $10^{-12}$ Torr.

Illustration 56 is the energy converter of any previous or subsequent illustration, further comprising a getter positioned within the enclosed evacuated volume for removing gas from within the enclosed evacuated volume.

Illustration 57 is the energy converter of any previous or subsequent illustration, wherein the housing is hermetically sealed.

Illustration 58 is the energy converter of any previous or subsequent illustration, further comprising a magnetic field source positioned to direct a magnetic field between the cathode and the anode.

Illustration 59 is the energy converter of any previous or subsequent illustration, wherein the magnetic field source is a permanent magnet or an electromagnet.

Illustration 60 is the energy converter of any previous or subsequent illustration, further comprising a magnetic core positioned for concentrating and guiding the magnetic field between the first electrode and the second electrode.

Illustration 61 is the energy converter of any previous or subsequent illustration, wherein magnetic field lines generated by the magnetic field source are arranged along a direction between the first electrode and the fourth electrode.

Illustration 62 is the energy converter of any previous or subsequent illustration, wherein magnetic lines generated by the magnetic field source are arranged along a direction parallel to an average electron trajectory between the first electrode and the fourth electrode.

Illustration 63 is the energy converter of any previous or subsequent illustration, further comprising a thermal conductor in thermal communication with the first electrode, the thermal conductor for receiving radiant energy or thermal energy to heat the first electrode.

Illustration 64 is the energy converter of any previous or subsequent illustration, further comprising one or more electrically insulating spacer elements between adjacent electrodes.

Illustration 65 is the energy converter of any previous or subsequent illustration, further comprising a switching power supply for generating voltages applied to one or more electrodes, wherein the switching power supply is in electrical communication with the one or more electrodes.

Illustration 66 is the energy converter of any previous or subsequent illustration, further comprising a control circuit in electrical communication with one or more electrodes for modulating potentials applied to one or more electrodes.

Illustration 67 is the energy converter of any previous or subsequent illustration, further comprising a dynode positioned adjacent to the third electrode, wherein the dynode is positioned between the third electrode and the inductive element.

Illustration 68 is the energy converter of any previous or subsequent illustration, wherein an inter-element spacing between the dynode and the third electrode is from about 0.5 µm to about 200 µm.

Illustration 69 is the energy converter of any previous or subsequent illustration, wherein the dynode has a higher potential than the third electrode.

Illustration 70 is the energy converter of any previous or subsequent illustration, wherein the dynode comprises one or more of a metal foil, synthetic diamond, or a secondary electron emission coating.

Illustration 71 is the energy converter of any previous or subsequent illustration, further comprising one or more conductive alloy electrodes for fixing positions of the first electrode, the second electrode, or the third electrode.

Illustration 72 is the energy converter of any previous or subsequent illustration, wherein any or all components are fabricated using one or more microfabrication techniques.

Illustration 73 is a system comprising: a heat source; and a plurality of energy converters arranged in a spaced configuration about the heat source.

Illustration 74 is the system of any previous or subsequent illustration, wherein the plurality of energy converters are arranged radially about the heat source.

Illustration 75 is the system of any previous or subsequent illustration, wherein the heat source comprises a combustor.

Illustration 76 is the system of any previous or subsequent illustration, wherein the plurality of energy converters make up a majority of one or more walls of the combustor.

Illustration 77 is the system of any previous or subsequent illustration, wherein multiple energy converters are arranged in a tandem configuration to provide cascading thermal conversion.

Illustration 78 is the system of any previous or subsequent illustration, wherein at least a portion of one or more walls of the combustor include 3-dimensional surface features that reflect electromagnetic radiation having wavelengths of from 0.8 µm to 1.5 µm.

Illustration 79 is the system of any previous or subsequent illustration, wherein at least a portion of one or more walls of the combustor are coated with or comprise aluminum zinc-doped oxide to suppress emission of black body radiation at wavelengths greater than 1.5 µm or from 1.5 µm to 5 µm.

Illustration 80 is the system of any previous or subsequent illustration, wherein the combustor has a temperature of from about 400° C. to about 1100° C. and generates black body electromagnetic radiation, and wherein at least a portion of the black body electromagnetic radiation is transmitted and absorbed by the plurality of energy converters to heat portions of the plurality of energy converters.

Illustration 81 is the system of any previous illustration, wherein one or more of the plurality of energy converters independently comprise an energy converter of any previous illustration.

REFERENCES

U.S. Pat. Nos. 3,265,910, 3,328,611, 3,519,854, 3,702,408, 4,303,845, 4,323,808, 5,459,367, 5,780,954, 5,810,980, 5,942,834, 5,981,071, 5,994,638, 6,103,298, 6,211,465, 6,229,083, 6,495,843, 8,853,531, 9,865,789, 8,853,531, and 3,460,524 are hereby incorporated by reference.

Lauren Rand, John Williams, Joseph Blakely, Brian Beal, and Daniel Brown, "C12A7 Electride Hollow Cathode," Conference paper for the JANNAF Space Subcommittee meeting, Colorado Springs, Colo., 29 Apr.-3 May 2013 is hereby incorporated by reference.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference.

All patents and publications mentioned in the specification are indicative of the levels of skill of those skilled in the art to which the invention pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art. For example, when a compound is claimed, it should be understood that compounds known in the prior art, including certain compounds disclosed in the references disclosed herein (particularly in referenced patent documents), are not intended to be included in the claim.

When a group of substituents is disclosed herein, it is understood that all individual members of those groups and all subgroups and classes that can be formed using the substituents are disclosed separately. When a Markush group or other grouping is used herein, all individual members of the group and all combinations and subcombinations possible of the group are intended to be individually included in the disclosure. As used herein, "and/or" means that one, all, or any combination of items in a list separated by "and/or" are included in the list; for example "1, 2 and/or 3" is equivalent to "'1' or '2' or '3' or '1 and 2' or '1 and 3' or '2 and 3' or '1, 2 and 3'".

Every formulation or combination of components described or exemplified can be used to practice the invention, unless otherwise stated. Specific names of materials are intended to be exemplary, as it is known that one of ordinary skill in the art can name the same material differently. One of ordinary skill in the art will appreciate that methods, device elements, starting materials, and techniques other than those specifically exemplified can be employed in the practice of the invention without resort to undue experimentation. All art-known functional equivalents, of any such methods, device elements, starting materials, and techniques are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and illustration and not of limitation, and there is no intention in the use of such terms and expressions of excluding any equivalents of the features shown and described or portions thereof. It will be recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. An energy converter comprising:
   a first electrode for emitting electrons, wherein the first electrode includes a plurality of microtips extending from a base surface of the first electrode, and wherein the first electrode includes an emissive carbon coating over at least a portion of the microtips;
   a second electrode adjacent to the first electrode;
   a third electrode adjacent to the second electrode, wherein the second electrode is positioned between the third electrode and the first electrode;
   an inductive element adjacent to the third electrode, wherein the third electrode is positioned between the second electrode and the inductive element;
   a fourth electrode for collected electrons emitted from the first electrode, wherein the fourth electrode is adjacent to the inductive element, and wherein the inductive element is positioned between the third electrode and the fourth electrode; and
   a housing defining an enclosed evacuated volume, wherein the first electrode, the second electrode, the third electrode, the inductive element, and the fourth electrode are positioned within the enclosed evacuated volume.

2. The energy converter of claim 1, wherein the first electrode comprises a cathode, wherein the second electrode comprises a control grid electrode, and wherein the third electrode comprises an acceleration grid electrode.

3. The energy converter of claim 1, wherein the first electrode comprises a material having a work function of from about 0.25 eV to about 3 eV.

4. The energy converter of claim 1, wherein the first electrode comprises a crystalline ceramic electride coating.

5. The energy converter of claim 1, wherein the emissive carbon coating comprises a doped or undoped amorphous carbon coating, and/or wherein the emissive carbon coating is doped with one or more of hydrogen, nitrogen, or boron.

6. The energy converter of claim 1, wherein the second electrode has a potential that varies as a function of time, wherein a potential applied to the second electrode modulates a current of electrons between the first electrode and the fourth electrode, and/or wherein a potential applied to the second electrode focuses electrons between the first electrode and the fourth electrode.

7. The energy converter of claim 1, wherein the third electrode has a potential that varies as a function of time and modulates a velocity of electrons passing through apertures of the third electrode.

8. The energy converter of claim 7, wherein the potential has a square wave modulation with a frequency of from 1 kHz to 1 MHz and/or a sinusoidal modulation with a frequency of from about 25 Hz to about 400 Hz.

9. The energy converter of claim 1, wherein the inductive element comprises an air core inductor or a solid core inductor.

10. The energy converter of claim 1, wherein electrons passing through an opening of the inductive element induce a current in the inductive element, induce a voltage across the inductive element, and are decelerated by interactions with the inductive element.

11. The energy converter of claim 1, wherein the fourth electrode has a non-planar geometry and/or wherein the fourth electrode comprises a plurality of stages.

12. The energy converter of claim 1, wherein the fourth electrode comprises a material having a work function between about 0.25 eV and about 2.5 eV.

13. The energy converter of claim 1, wherein the fourth electrode comprises a second emissive carbon coating.

14. The energy converter of claim 1, further comprising a magnetic field source positioned to direct a magnetic field between the first electrode and the fourth electrode.

15. The energy converter of claim 14, further comprising a magnetic core positioned for concentrating and guiding the magnetic field between the first electrode and the second electrode.

16. The energy converter of claim 1, further comprising a control circuit in electrical communication with one or more electrodes for modulating potentials applied to one or more electrodes.

17. The energy converter of claim 1, further comprising a dynode positioned adjacent to the third electrode, wherein the dynode is positioned between the third electrode and the inductive element.

18. The energy converter of claim 1, wherein any or all components are fabricated using one or more microfabrication techniques.

19. A system comprising:
a heat source; and
a plurality of energy converters arranged in a spaced configuration about the heat source, wherein one or more of the plurality of energy converters independently comprise the energy converter of claim 1.

20. The system of claim 19, wherein the heat source comprises a combustor.

21. The system of claim 20, wherein at least a portion of one or more walls of the combustor include 3-dimensional surface features that reflect electromagnetic radiation having wavelengths of from 0.8 μm to 1.5 μm, wherein at least a portion of one or more walls of the combustor are coated with or comprise aluminum zinc-doped oxide to suppress emission of black body radiation at wavelengths greater than 1.5 μm or from 1.5 μm to 5 μm, and/or wherein the combustor has a temperature of from about 400° C. to about 1100° C. and generates black body electromagnetic radiation, and wherein at least a portion of the black body electromagnetic radiation is transmitted and absorbed by the plurality of energy converters to heat portions of the plurality of energy converters.

* * * * *